US010256248B2

(12) United States Patent
Lu et al.

(10) Patent No.: US 10,256,248 B2
(45) Date of Patent: Apr. 9, 2019

(54) THROUGH-MEMORY-LEVEL VIA STRUCTURES BETWEEN STAIRCASE REGIONS IN A THREE-DIMENSIONAL MEMORY DEVICE AND METHOD OF MAKING THEREOF

(71) Applicant: SANDISK TECHNOLOGIES LLC, Plano, TX (US)

(72) Inventors: Zhenyu Lu, Milpitas, CA (US); Jixin Yu, Milpitas, CA (US); Johann Alsmeier, San Jose, CA (US); Fumiaki Toyama, Cupertino, CA (US); Yuki Mizutani, San Jose, CA (US); Hiroyuki Ogawa, Yokkaichi (JP); Chun Ge, Milpitas, CA (US); Daxin Mao, Cupertino, CA (US); Yanli Zhang, San Jose, CA (US); Alexander Chu, Milpitas, CA (US); Yan Li, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/175,450

(22) Filed: Jun. 7, 2016

(65) Prior Publication Data
US 2017/0352678 A1 Dec. 7, 2017

(51) Int. Cl.
H01L 27/11582 (2017.01)
H01L 21/48 (2006.01)
(Continued)

(52) U.S. Cl.
CPC ...... H01L 27/11582 (2013.01); H01L 21/486 (2013.01); H01L 21/4846 (2013.01);
(Continued)

(58) Field of Classification Search
CPC ............. H01L 27/11582; H01L 23/498; H01L 23/49827; H01L 23/49844; H01L 21/4846
See application file for complete search history.

(56) References Cited

U.S. PATENT DOCUMENTS 5,915,167 A 6/1999 Leedy
9,224,747 B2 12/2015 Mizutani et al.
(Continued)

FOREIGN PATENT DOCUMENTS

WO WO2016060787 A1 4/2016

OTHER PUBLICATIONS

U.S. Appl. No. 14/291,415, filed May 30, 2014, San Disk 3D LLC.
(Continued)

Primary Examiner — Tucker J Wright
Assistant Examiner — Wilner Jean Baptiste
(74) Attorney, Agent, or Firm — The Marbury Law Group PLLC

(57) ABSTRACT

Lower level metal interconnect structures are formed over a substrate with semiconductor devices thereupon. A semiconductor material layer and an alternating stack of spacer dielectric layers and insulating layers is formed over the lower level metal interconnect structures. An array of memory stack structures is formed through the alternating stack. Trenches are formed through the alternating stack such that a staircase region is located farther away from a threshold lateral distance from the trenches, while neighboring staircase regions are formed within the threshold lateral distance from the trenches. Portions of the spacer dielectric layers proximal to the trenches are replaced with electrically conductive layers, while a remaining portion of the alternating stack is present in the staircase region. At least one through-memory-level via structure can be formed through the remaining portions of the spacer dielectric layers
(Continued)

and the insulating layers to provide a vertically conductive path through a memory-level assembly.

25 Claims, 34 Drawing Sheets

(51) Int. Cl.
    *H01L 23/498*     (2006.01)
    *H01L 29/66*     (2006.01)
    *H01L 29/792*     (2006.01)
    *H01L 27/1157*     (2017.01)
    *H01L 27/11573*     (2017.01)
    *H01L 27/11575*     (2017.01)

(52) U.S. Cl.
    CPC ........ *H01L 21/4853* (2013.01); *H01L 23/498* (2013.01); *H01L 23/49827* (2013.01); *H01L 23/49844* (2013.01); *H01L 27/1157* (2013.01); *H01L 27/11573* (2013.01); *H01L 27/11575* (2013.01); *H01L 29/66833* (2013.01); *H01L 29/7926* (2013.01)

(56) References Cited

U.S. PATENT DOCUMENTS

| | | |
|---|---|---|
| 9,236,392 B1 | 1/2016 | Izumi et al. |
| 9,356,034 B1 | 5/2016 | Yada et al. |
| 9,589,982 B1* | 3/2017 | Cheng .............. H01L 27/11582 |
| 2012/0061744 A1* | 3/2012 | Hwang ............. H01L 27/11565 257/324 |
| 2014/0061748 A1 | 3/2014 | Lee |
| 2016/0027730 A1 | 1/2016 | Lee |
| 2016/0064821 A1 | 3/2016 | Izumi et al. |
| 2016/0071876 A1 | 3/2016 | Mizuno et al. |
| 2016/0111434 A1 | 4/2016 | Pachamuthu et al. |
| 2017/0077118 A1* | 3/2017 | Cheng .............. H01L 27/11582 |

OTHER PUBLICATIONS

U.S. Appl. No. 14/739,284, filed Jun. 15, 2015, SanDisk Technologies Inc.
U.S. Appl. No. 14/739,354, filed Jun. 15, 2015, SanDisk Technologies Inc.
U.S. Appl. No. 15/043,761, filed Feb. 15, 2016, SanDisk Technologies Inc.
U.S. Appl. No. 15/046,780, filed Feb. 18, 2016, SanDisk Technologies Inc.
International Search Report and Written Opinion of the International Searching Authority for International Patent Application No. PCT/US2017/018714, dated May 31, 2017, 17 pages.
International Preliminary Report on Patentability and Written Opinion of the International Searching Authority for International Patent Application No. PCT/US2017/018714, dated Dec. 20m, 2018, 11 pages.

* cited by examiner

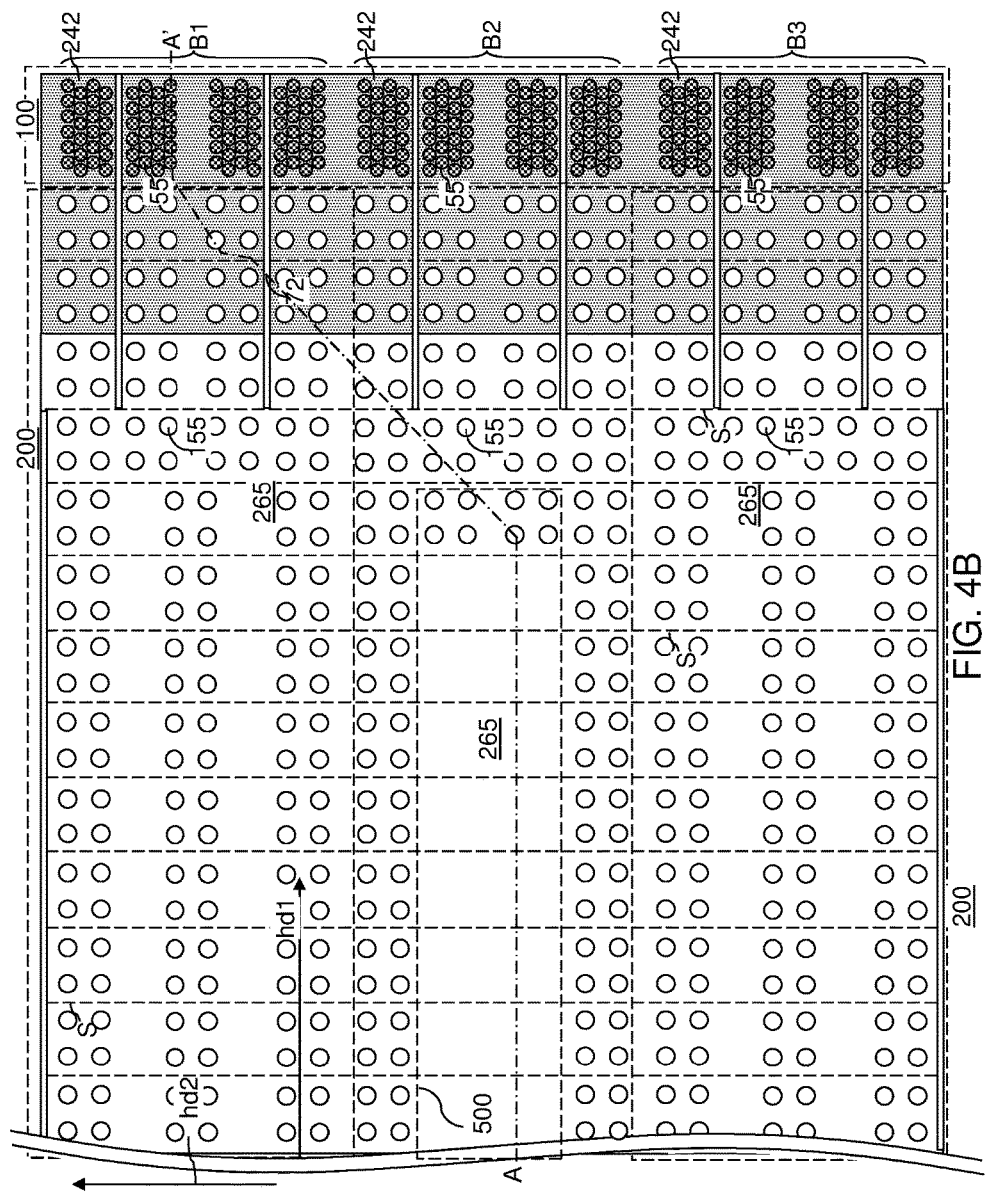

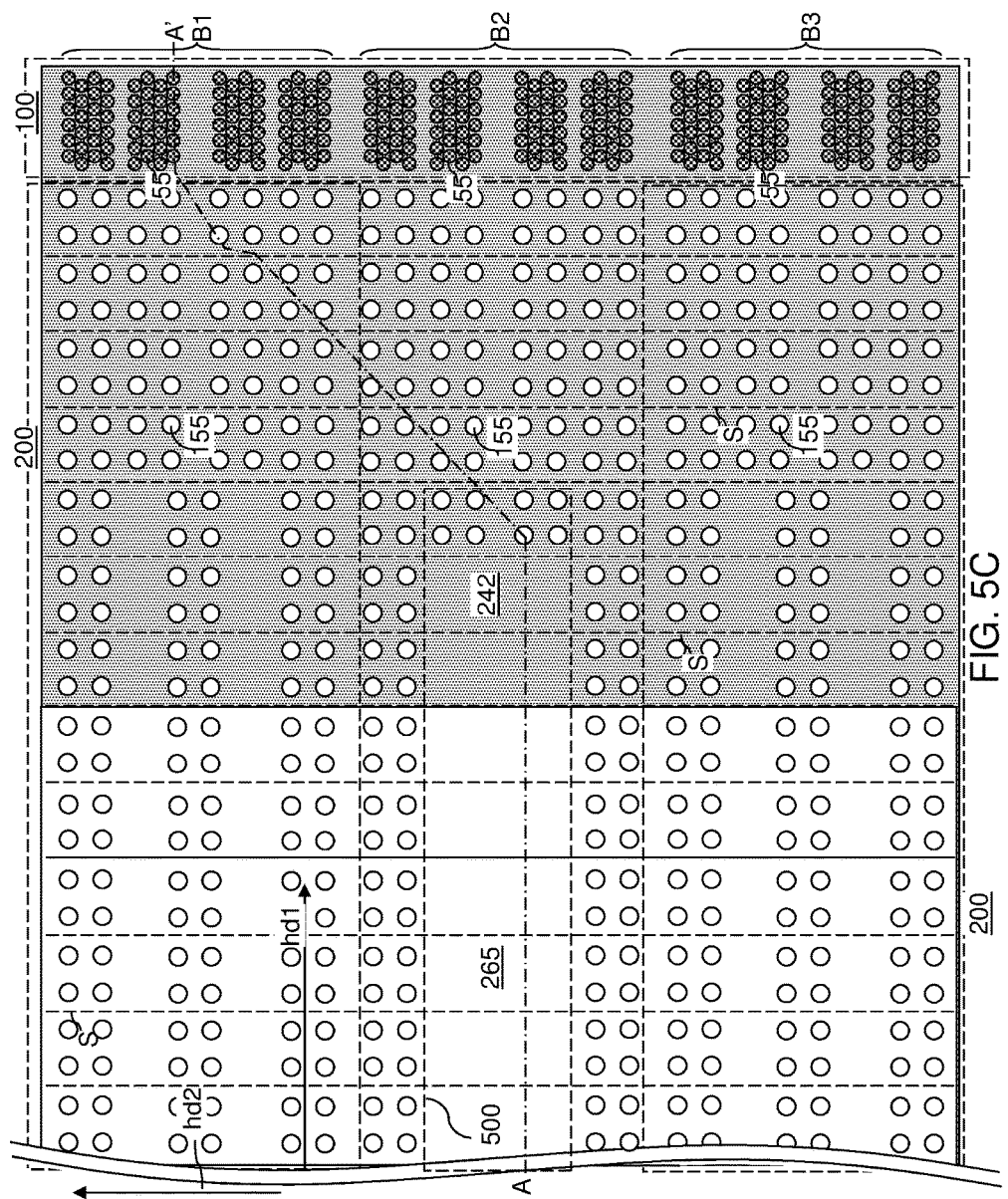

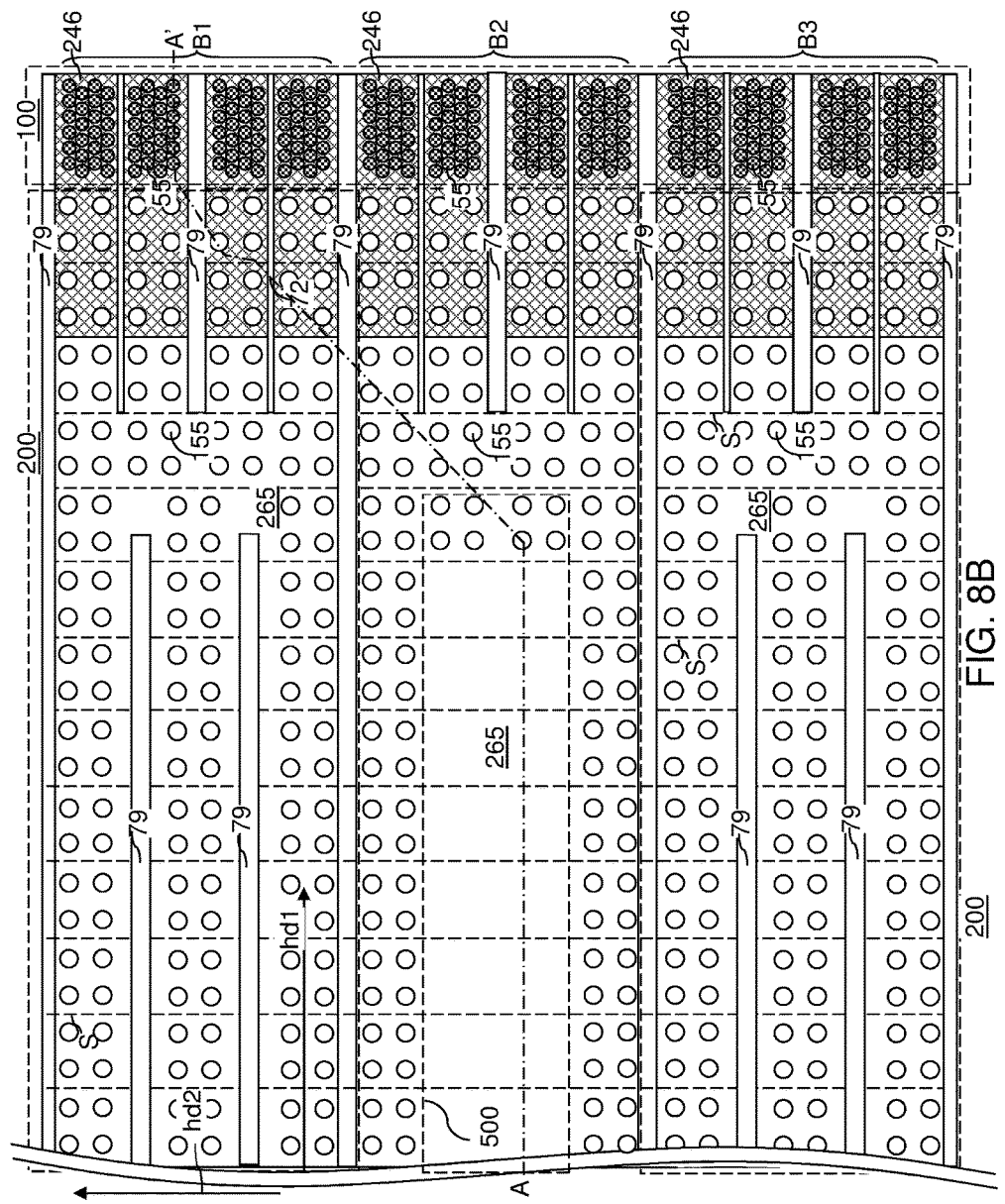

THROUGH-MEMORY-LEVEL VIA STRUCTURES BETWEEN STAIRCASE REGIONS IN A THREE-DIMENSIONAL MEMORY DEVICE AND METHOD OF MAKING THEREOF

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

As three-dimensional memory devices scale to smaller device dimensions, the device area for peripheral devices can take up a significant portion of the total chip area. Thus, a method of providing various peripheral devices, such as word line driver circuits, without significantly increasing the total chip size is desired. Further, an efficient power distribution network in the array of memory stack structures can increase performance of three-dimensional memory devices. A method of enhancing power distribution without excessively increasing the footprint of a semiconductor chip is also desired.

SUMMARY

According to an aspect of the present disclosure, a semiconductor structure is provided, which includes: a memory-level assembly located over a semiconductor substrate and comprising at least one first alternating stack of electrically conductive layers and first portions of insulating layers, and further comprising memory stack structures vertically extending through the memory-level assembly; and a plurality of laterally-elongated contact via structures that are located within respective trenches, vertically extend through the memory-level assembly, and laterally extend along a first horizontal direction. A first subset of the plurality of laterally-elongated contact via structures laterally divides the at least one alternating stack into a plurality of laterally spaced-apart blocks. The plurality of blocks comprises a set of three neighboring blocks including, in order, a first block, a second block, and third block arranged along a second horizontal direction that is perpendicular to the first horizontal direction. The semiconductor structure further includes at least one second alternating stack adjoining the second block and including alternating layers of spacer dielectric layers and second portions of the insulating layers, and each of the spacer dielectric layers is located at a same level as a respective electrically conductive layer, and each spacer dielectric layer has a lesser lateral extent along the first horizontal direction than any underlying spacer dielectric layer; and at least one through-memory-level via structure comprising a conductive material and vertically extending through the at least one second alternating stack from a first horizontal plane including a topmost surface of the memory-level assembly and a second horizontal plane including a bottommost surface of the memory-level assembly.

According to another aspect of the present disclosure, a method of forming a semiconductor structure is provided. At least one alternating stack of insulating layers and spacer dielectric layers is formed over a substrate. Memory stack structures are formed through the at least one alternating stack. Each of the memory stack structures comprises a memory film and a vertical semiconductor channel. Trenches that extend along a first horizontal direction are formed through the at least one alternating stack. A through-memory-level via region of the at least one alternating stack is laterally spaced farther from each of the trenches than a threshold lateral distance. Portions of the spacer dielectric layers outside the through-memory-level via region are replaced with electrically conductive layers while the through-memory-level via region of the at least one alternating stack remains intact to provide a remaining portion of the at least one alternating stack. The electrically conductive layers constitute word lines for the memory stack structures. At least one through-memory-level via structure is formed through the remaining portion of the at least one alternating stack. Each of the at least one through-memory-level via structure extends from a first horizontal plane including a topmost surface of a remaining portion of the at least one alternating stack and a bottommost surface of the at least one alternating stack.

BRIEF DESCRIPTION OF THE DRAWINGS

FIG. 4B is a horizontal cross-sectional view of the exemplary structure along the horizontal plane B-B' in FIG. 4A. The zig-zag vertical plane A-A' corresponds to the plane of the vertical cross-sectional view of FIG. 4A.

FIG. 5C is a horizontal cross-sectional view of the exemplary structure along the horizontal plane C-C' in FIG. 5A.

FIG. 8B is a horizontal cross-sectional view of the exemplary structure along the horizontal planeB-B' in FIG. 8A. The zig-zag vertical plane A-A' corresponds to the plane of the vertical cross-sectional view of FIG. 8A.

DETAILED DESCRIPTION

Figure 1A:
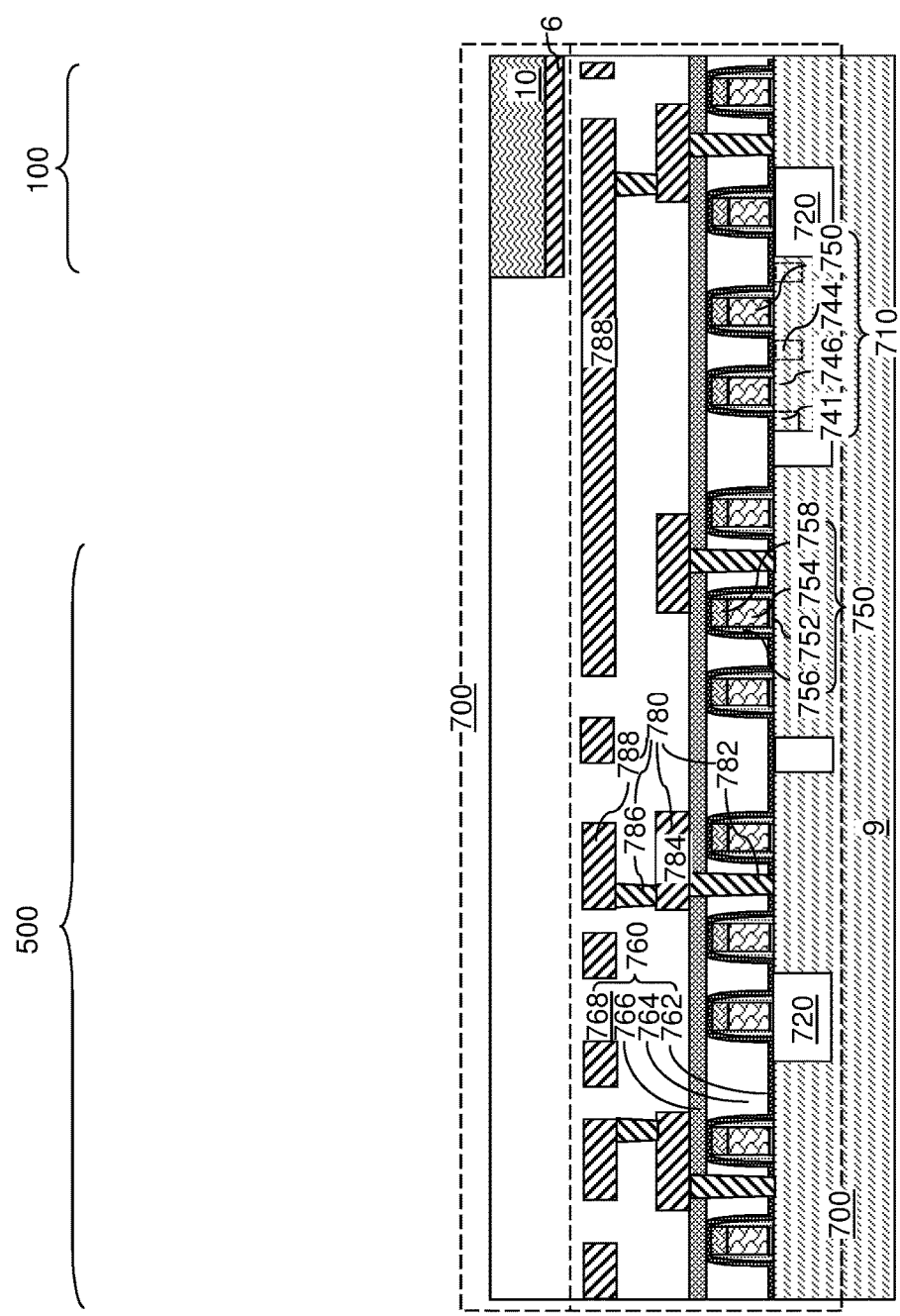
FIG. 1A is a vertical cross-sectional view of an exemplary structure after formation of semiconductor devices, at least one lower level dielectric layer, and lower level metal interconnect structures on a semiconductor substrate according to a first embodiment of the present disclosure.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, any two or more measurable quantities are "substantially the same" if each of the two or more measurable quantities do not deviate from the average of the two or more measurable quantities by more than 2.5% of the average of the two or more measurable quantities. For example, a first lateral distance is substantially the same as a second lateral distance if the first lateral distance and the second lateral distance do not deviate from the average of the first lateral distance and the second lateral distance by more than 2.5% of the average of the first lateral distance and the second lateral distance.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1B:
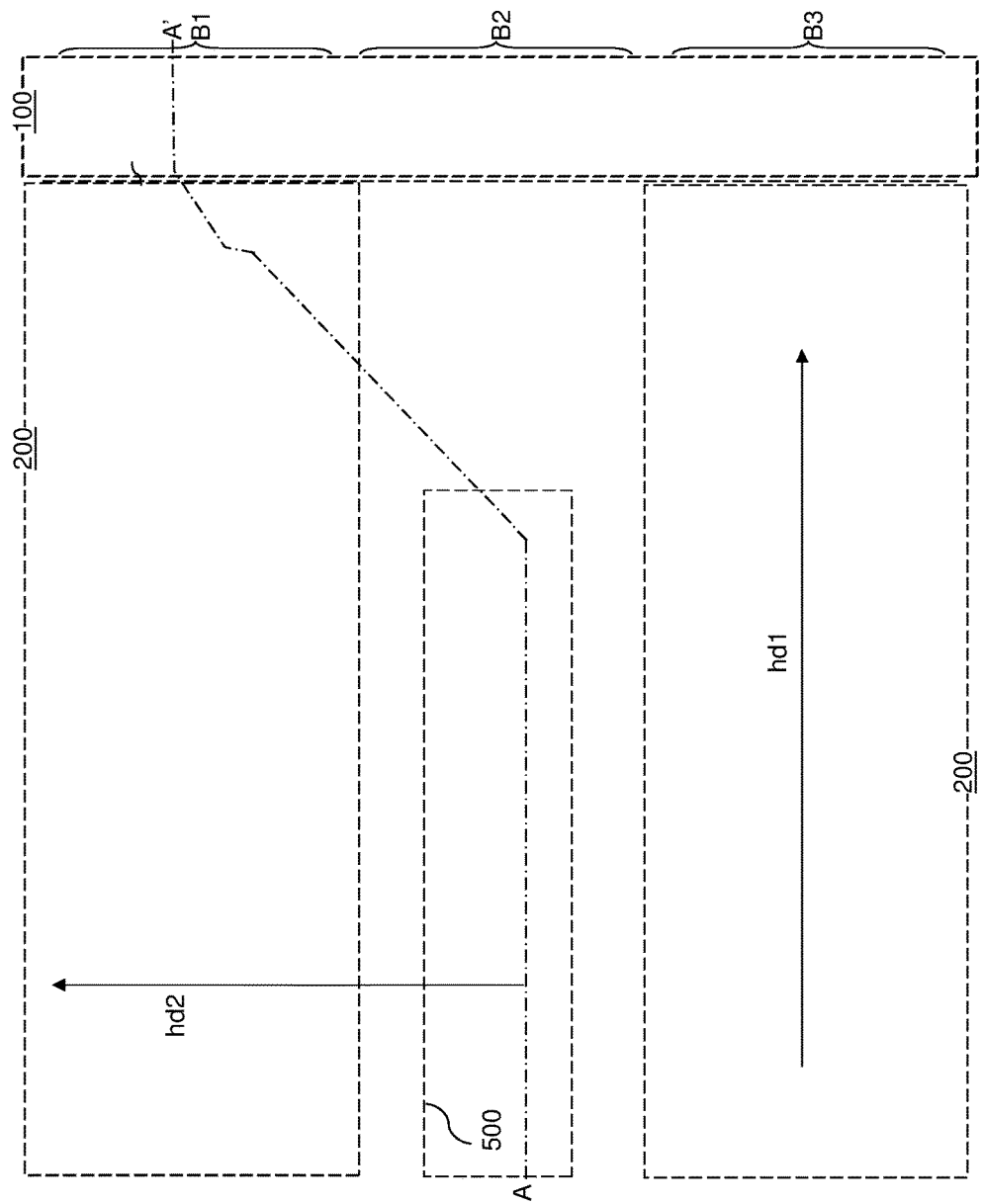
FIG. 1B is a schematic plan view of the exemplary structure of FIG. 1A.

Referring to FIGS. 1A and 1B, an exemplary structure according to an embodiment of the present disclosure is illustrated. The exemplary structure includes a semiconductor substrate 9, and semiconductor devices 710 formed thereupon. Shallow trench isolation structures 720 can be formed in an upper portion of the semiconductor substrate 9 to provide electrical isolation among the semiconductor devices 710. The semiconductor devices 710 can include, for example, field effect transistors including respective source regions 741, drain regions 744, channel regions 746 and gate structures 750. The field effect transistors may be arranged in a CMOS configuration. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to nodes (e.g., source 741, drain 744 or gate electrodes 750) of the semiconductor devices 710 (e.g., CMOS devices), and are located at the level of the at least one lower level dielectric layer 760. The through-memory-level via structures (not shown in FIG. 1A) can be subsequently formed directly on the lower level metal interconnect structures 780. In one embodiment, the pattern of the lower level metal interconnect structures 780 can be selected such that the lower level topmost metal structures 788, which are a subset of the lower level metal interconnect structures 780 located at the topmost portion of the lower level metal interconnect structures 780, can provide landing pad structures within a through-memory-level via region 500. The through-memory-level via region 500 is a region in which through-memory-level via structures that extend vertically through a memory-level assembly are subsequently formed.

The through-memory-level via region 500 can be located adjacent to a memory array region 100 in which an array of memory devices are subsequently formed. A word line contact via region 200 can be located adjacent to the through-memory-level via region 500 and the memory array region 100. In one embodiment, the through-memory-level via region 500 and the word line contact via region 200 can be located at a peripheral edge of the memory array region 100 that is perpendicular to a first horizontal direction h1 and runs parallel to a second horizontal direction hd2. In one embodiment, the area of the exemplary structure can be divided into multiple blocks (B1, B2, B3, . . . ) that are laterally separated along the second horizontal direction hd2 and can be one-to-one mapped with positive integers, i.e., can be indexed with positive integers.

Multiple instances of the through-memory-level via region 500 and the word line contact via region 200 can alternate along the second horizontal direction hd2. In an illustrative example, each instance of the through-memory-level via region 500 can be located within an area of a respective even numbered block (such as B2, B4, etc.), and each instance of the word line contact via region 200 can be located within an area of a respective odd numbered block (such as B1, B3, etc.). Alternatively, regions 500 can be located in a respective odd block and regions 200 can be located in a respective even block. In another alternative configuration, regions 500 and 200 each can be located in odd and even blocks, e.g., two adjacent blocks may have regions 200 while the next one, two or more adjacent blocks in direction hd2 may have regions 500. A neighboring pair of an odd-numbered block and an even-numbered block (such as B1 and B2) can be periodically repeated along the second horizontal direction.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

An optional planar conductive material layer 6 and a planar semiconductor material layer 10 can be formed over the underlying peripheral device region 700. In one embodiment, an upper portion of the at least one lower level dielectric layer 760 may be recessed in the memory array region 100, and the optional planar conductive material layer 6 and the planar semiconductor material layer 10 may be formed in the recessed region of the at least one lower level dielectric layer 760. In another embodiment, the optional planar conductive material layer 6 and the planar semiconductor material layer 10 may be deposited as planar material layers over the at least one lower level dielectric layer 760, and the portion of the optional planar conductive material layer 6 and the planar semiconductor material layer 10 may be removed from the through-memory-level via region 500. The opening in the optional planar conductive material layer 6 and the planar semiconductor material layer 10 within the area of the through-memory-level via region 500 can be filled with a dielectric material (such as undoped silicate glass or doped silicate glass), which can be added to, and incorporated into, the at least one lower level dielectric layer 760.

The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

Figure 2A:
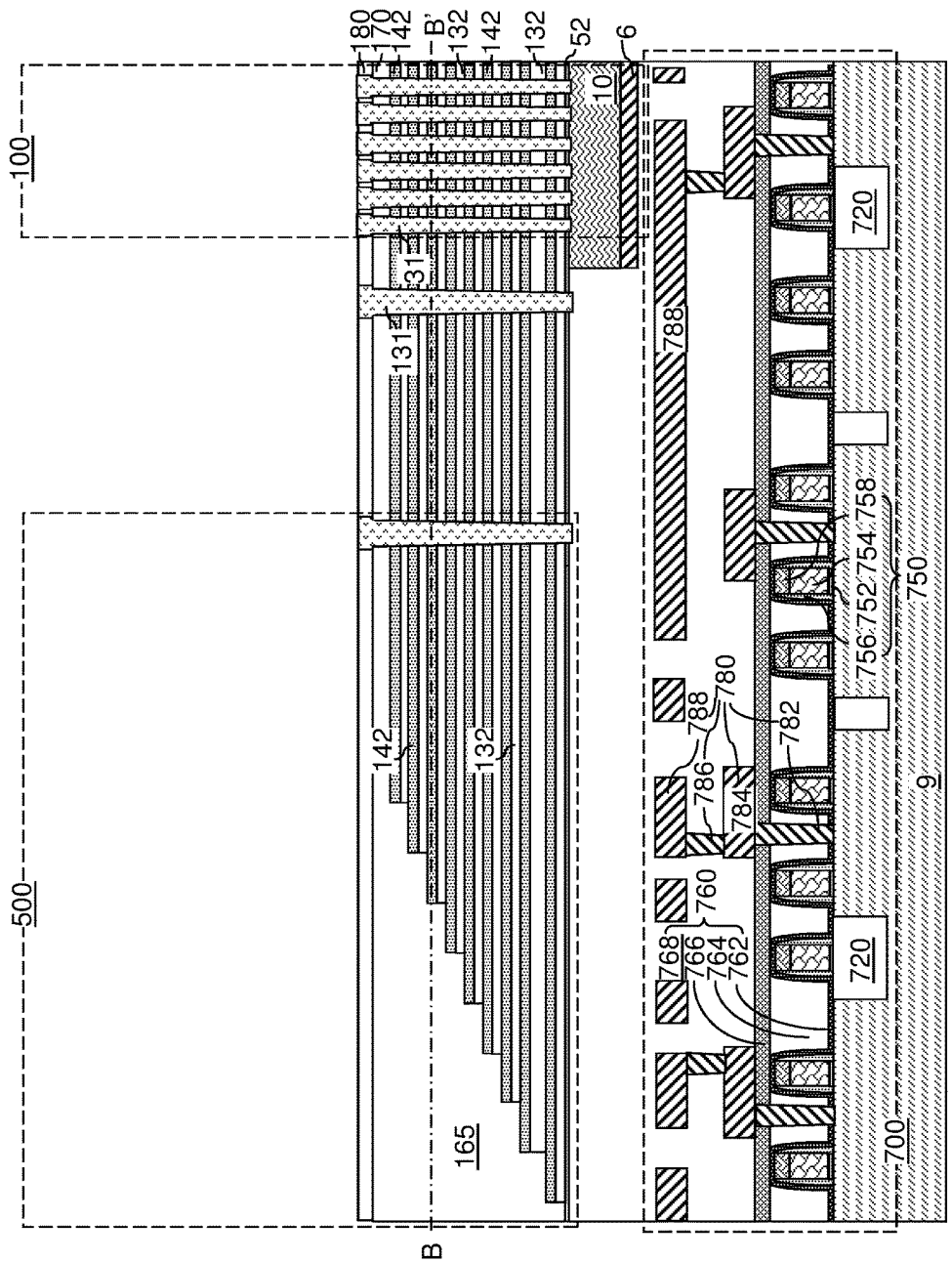
FIG. 2A is a vertical cross-sectional view of the exemplary structure after formation of a planar semiconductor material layer, a first-tier alternating stack of first insulting layers and first spacer dielectric layers, first-tier memory openings and first-tier support openings, and first-tier sacrificial opening fill portions according to an embodiment of the present disclosure.
Figure 2B:
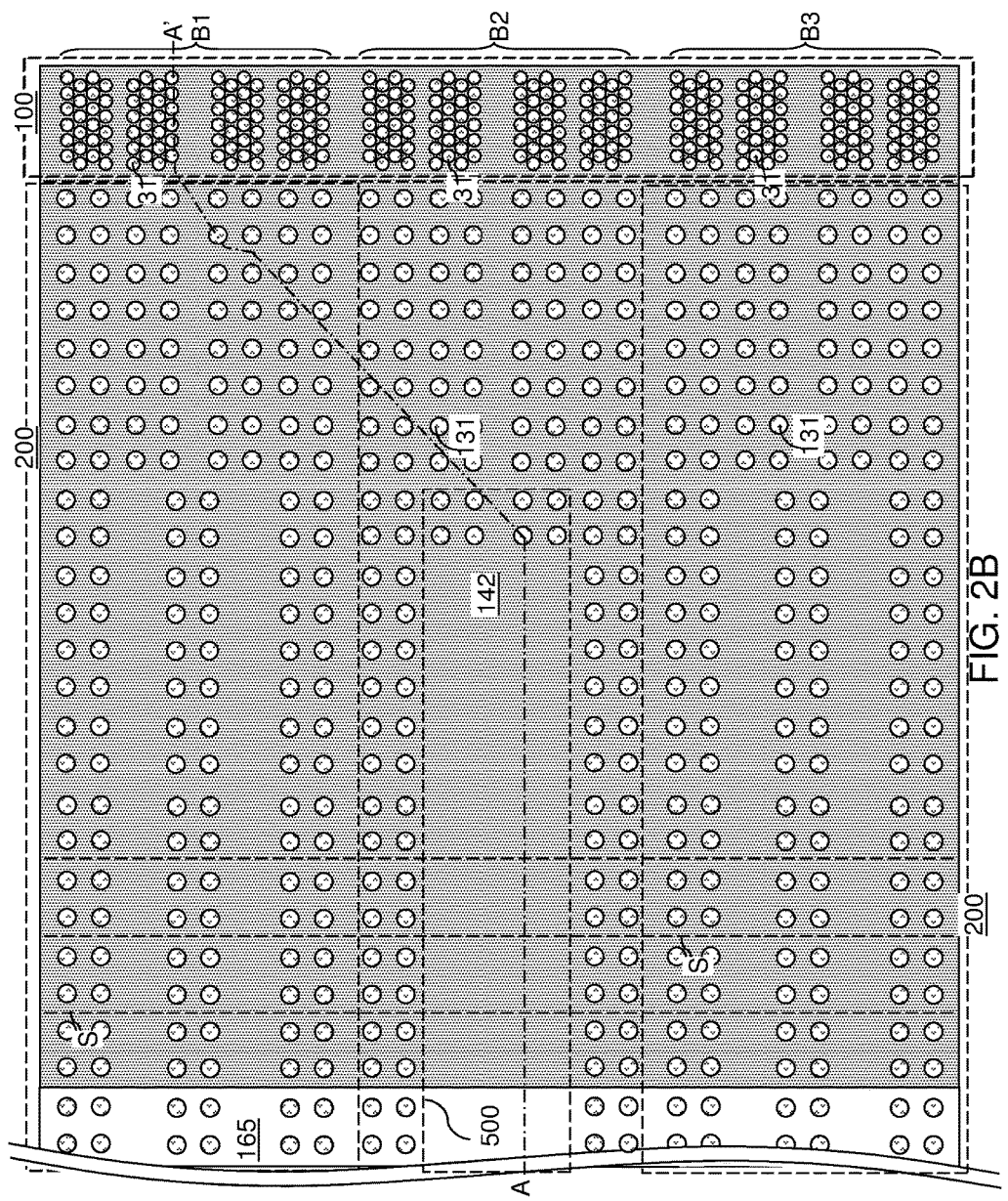
FIG. 2B is a horizontal cross-sectional view of the exemplary structure along the horizontal plane B-B' in FIG. 2A. The zig-zag vertical plane A-A' corresponds to the plane of the vertical cross-sectional view of FIG. 2A.

Referring to FIGS. 2A and 2B, a dielectric pad layer 52 can be formed on the top surface of the planar semiconductor material layer 10. An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

The first insulating cap layer 170 and the first-tier alternating stack (132, 142) can be patterned to form first stepped surfaces in each through-memory-level via region 500 and each word line contact via region 200. Each of the through-memory-level via regions 500 and the word line contact via regions 200 can include a respective first stepped area in which the first stepped surfaces are formed, and a second stepped area in which additional stepped surfaces are to be subsequently formed in a second tier structure (to be subsequently formed over a first tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified.

Optionally, an inter-tier dielectric layer 180 may be deposited over the first tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed.

Openings can be formed through the optional inter-tier dielectric layer 180 and the first tier structure (132, 142, 165, 170). The openings can include first-tier memory openings that are formed in the memory array region 100, and first-tier support openings that are formed in the through-memory-level via region 500. The first-tier memory openings extend to a top surface of the planar semiconductor material layer 10. The first-tier support openings can extend onto, and optionally into, the at least one lower level dielectric layer 760.

The first-tier memory openings can be formed in the memory array region 100 at locations at which memory stack structures including vertical stacks of memory elements are to be subsequently formed, and the first-tier support openings can be formed in the through-memory-stack via region 500. For example, a lithographic material stack (not shown) including at least a photoresist layer can be formed over the inter-tier dielectric layer 180, and can be lithographically patterned to form openings within the lithographic material stack. The pattern in the lithographic material stack can be transferred through the inter-tier dielectric layer 180, the first insulating cap layer 170, and through the entirety of the first-tier alternating stack (132, 142) by at least one anisotropic etch that employs the patterned lithographic material stack as an etch mask. Portions of the inter-tier dielectric layer 180, the first insulating cap layer 170, and the first-tier alternating stack (132, 142) underlying the openings in the patterned lithographic material stack are etched to form the first-tier memory openings and the first-tier support openings. In other words, the transfer of the pattern in the patterned lithographic material stack through the first insulating cap layer 170 and the first-tier alternating stack (132, 142) forms the first-tier memory openings and the first-tier support openings.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches. The sidewalls of the first-tier memory openings can be substantially vertical, or can be tapered. Subsequently, the patterned lithographic material stack can be subsequently removed, for example, by ashing. Optionally, the portions of the first-tier memory openings at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. In this case, portions of the first-tier memory openings and the first-tier support openings located at the level of the inter-tier dielectric layer 180 may be optionally widened to provide a larger landing pad for second-tier memory openings and second via openings to be subsequently formed through a second-tier alternating stack (to be subsequently formed prior to formation of the second-tier memory openings).

A sacrificial fill material can be deposited in each of the first-tier memory openings and the first-tier support openings. The sacrificial fill material layer includes a sacrificial material which can be subsequently removed selective to the materials of the first insulator layers 132 and the first sacrificial material layers 142. Optionally, a thin dielectric liner such as a silicon oxide liner (not shown) having a thickness in a range from 1 nm to 6 nm may be formed to facilitate subsequent selective removal of the sacrificial fill material. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In one embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the inter-tier dielectric layer 180. For example, the sacrificial fill material layer can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer. Each remaining portion of the sacrificial material in a first-tier memory opening constitutes a sacrificial memory opening fill portion 31. Each remaining portion of the sacrificial material in a first-tier support opening constitutes a sacrificial via fill portion 131. The top surfaces of the sacrificial memory opening fill portions 31 and the sacrificial via fill portions 131 can be coplanar with the top surface of the inter-tier dielectric layer 180. The sacrificial memory opening fill portion 31 and/or the sacrificial via fill portions 131 may, or may not, include cavities therein.

Figure 3A:
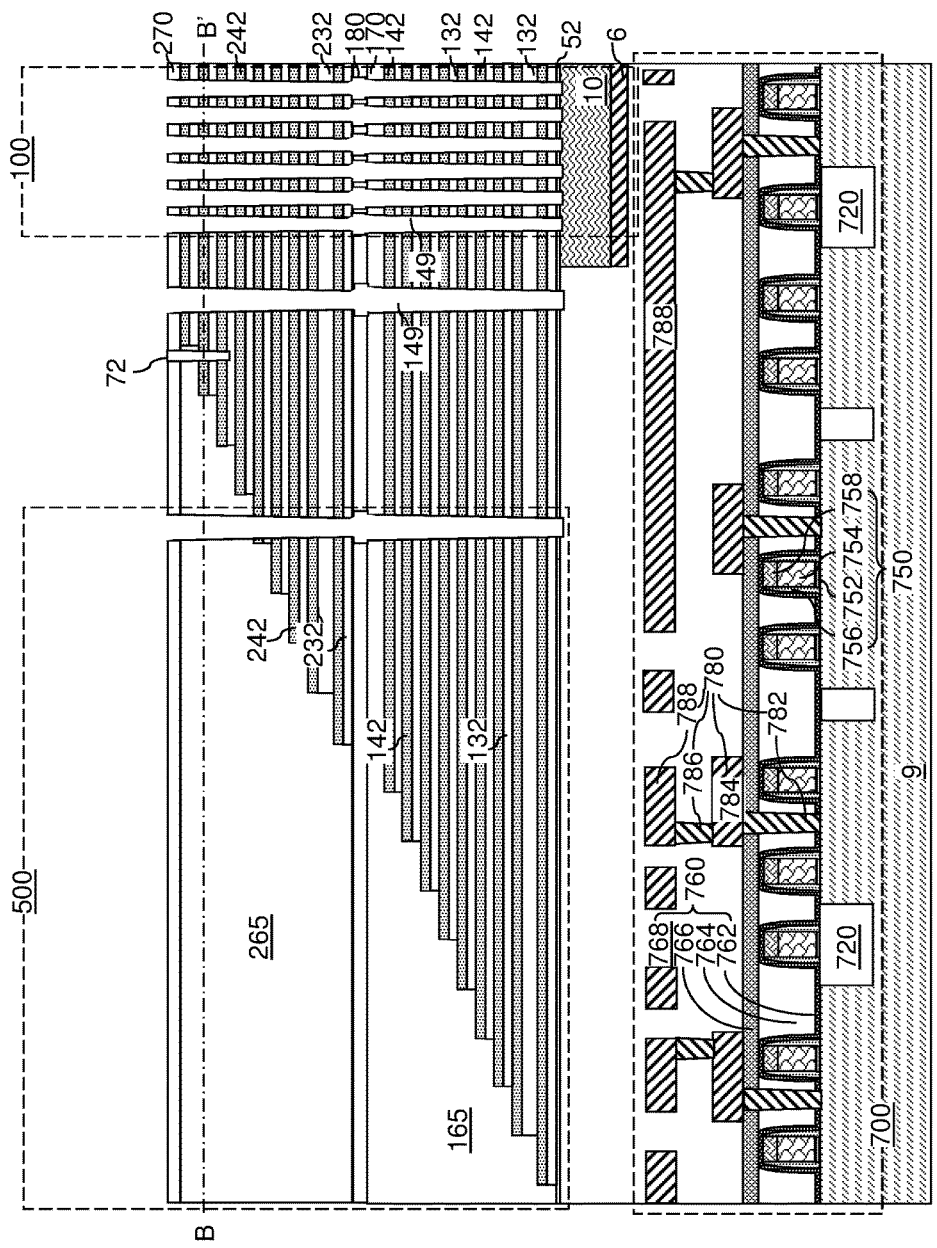
FIG. 3A is a vertical cross-sectional view of the exemplary structure after formation of a second-tier alternating stack of second insulating layers and second spacer dielectric layers, second-tier memory openings and second-tier support openings, and removal of the first-tier sacrificial opening fill portions according to an embodiment of the present disclosure.
Figure 3B:
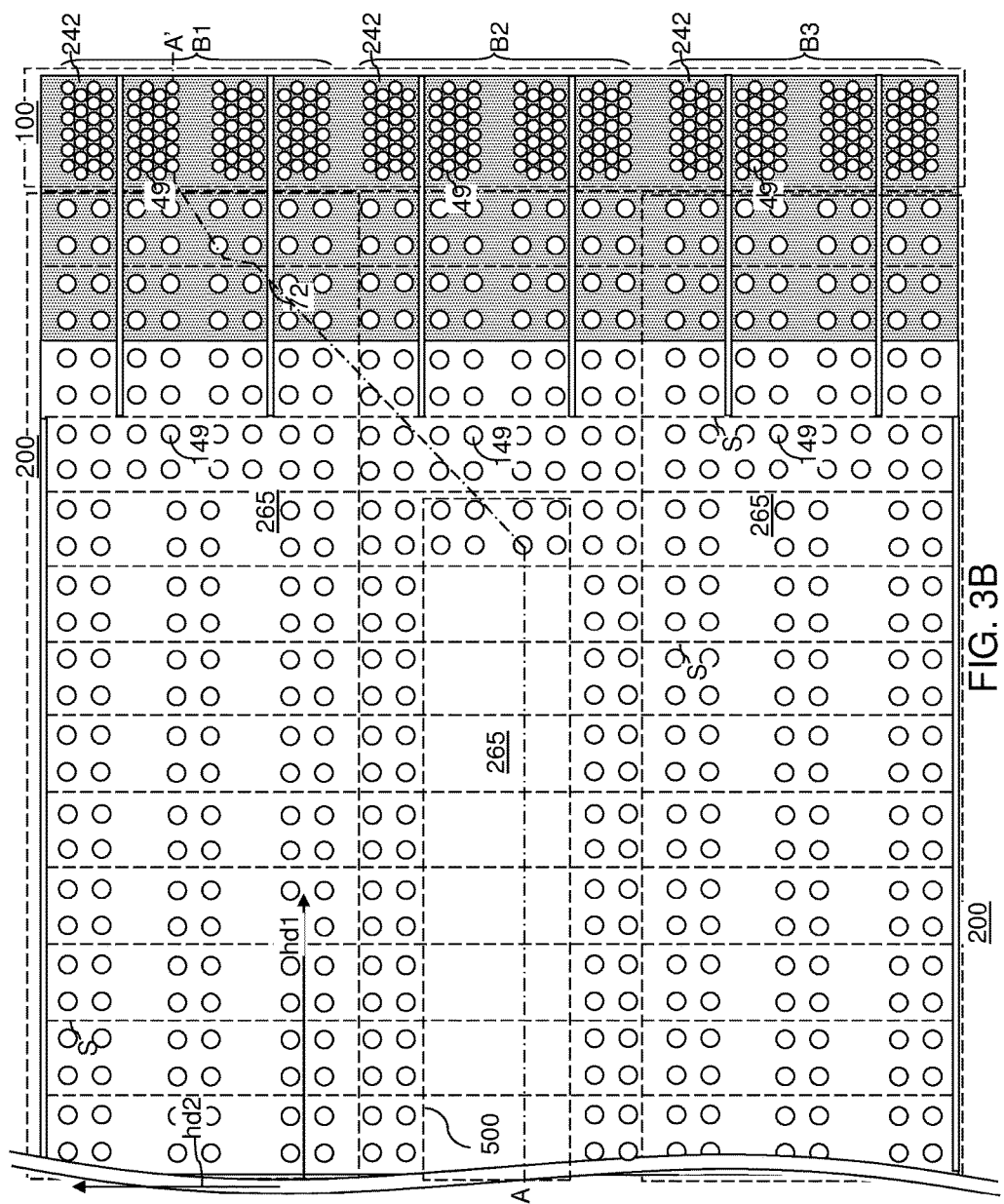
FIG. 3B is a horizontal cross-sectional view of the exemplary structure along the horizontal plane B-B' in FIG. 3A. The zig-zag vertical plane A-A' corresponds to the plane of the vertical cross-sectional view of FIG. 3A.

Referring to FIGS. 3A and 3B, a second tier structure can be formed over the first tier structure (132, 142, 165, 170, 31, 131). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area SA2 can be formed in the through-memory-level via regions 500 and the word line contact via regions 200 employing a same set of processing steps as the processing steps employed to form the first stepped surfaces in the first stepped area SA1 with suitable adjustment to the pattern of at least one masking layer. A second-tier retro-stepped dielectric material portion 265 can be formed over the second stepped surfaces in the through-memory-level via regions 500 and the word line contact via regions 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 extend along the first horizontal direction hd1 and divide blocks (B1, B2, B3, . . . ) into multiple sub-blocks in the second horizontal direction hd2. The drain-select-level shallow trench isolation structures 72 include a dielectric material such as silicon oxide. Locations of steps S in the first-tier alternating stack (132, 142) and the second-tier alternating stack (232, 242) are illustrated in FIG. 3B as dotted lines.

Openings can be formed through the second tier structure (232, 242, 265). The openings can include second-tier memory openings that overlie the sacrificial memory opening fill portions 31, and second-tier support openings that overlie the sacrificial via fill portions 131. For example, a photoresist layer can be applied over the second tier structure (232, 242, 265, 270), and can be lithographically patterned to form a same pattern as the pattern of the sacrificial memory opening fill portions 31 and the sacrificial via fill portions 131. The lithographic mask employed to pattern the first-tier memory openings and first-tier support openings can be employed to pattern the second-tier memory openings and the second tier support openings. An anisotropic etch can be performed to transfer the pattern of the lithographically patterned photoresist layer through the second tier structure (232, 242, 265, 270). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 31 can be physically exposed at the bottom of each second-tier memory opening. A top surface of an underlying sacrificial via fill portion 131 can be physically exposed at the bottom of each second-tier support opening. After the top surfaces of the sacrificial memory opening fill portions 31 and sacrificial via fill portions 131 are physically exposed, an etch process can be performed, which removes the sacrificial material of the sacrificial memory opening fill portions 31 and the sacrificial via fill portions 131 selective to the materials of the second-tier alternating stack (232, 242) and the first-tier alternating stack (132, 142).

Upon removal of the sacrificial memory opening fill portions 31, each vertically adjoining pair of a second-tier memory opening and a first-tier memory opening forms a continuous cavity that extends through the first-tier alternating stack (132, 142) and the second-tier alternating stack (232, 242). The continuous cavities are herein referred to as memory openings 49. A top surface of the planar semiconductor material layer 10 can be physically exposed at the bottom of each memory opening 49.

Upon removal of the sacrificial via fill portions 131, each vertically adjoining pair of a second-tier support opening and a first-tier support opening forms an additional continuous cavity that extends through the first-tier alternating stack (132, 142) and the second-tier alternating stack (232, 242). The additional continuous cavities are herein referred to as support openings 149. A top surface of the at least one lower level dielectric layer 760 can be physically exposed at the bottom of each support opening 149.

Figure 4A:
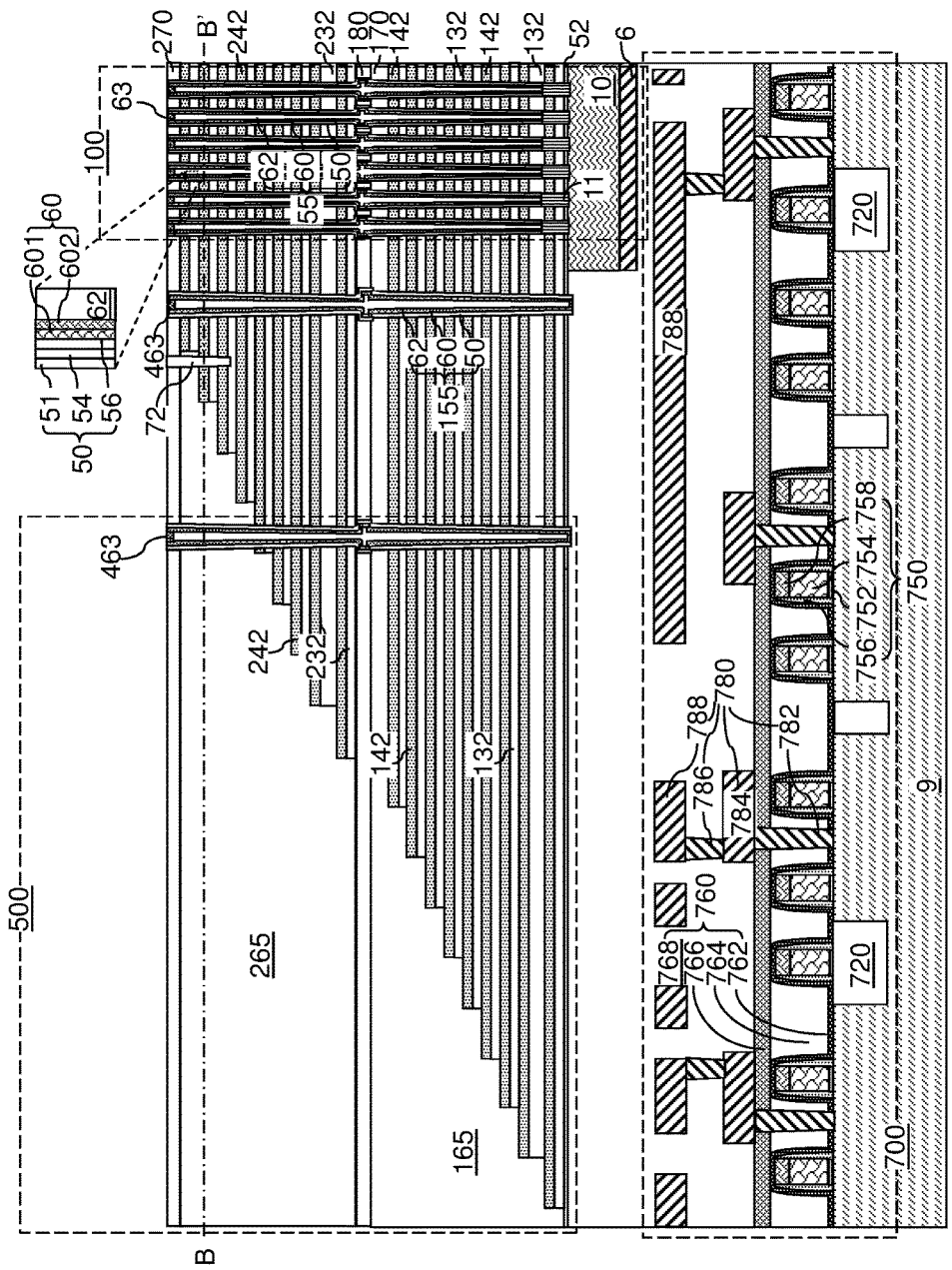
FIG. 4A is a vertical cross-sectional view of the exemplary structure after formation of memory stack structures and support pillar structures according to an embodiment of the present disclosure.
Figure 5A:
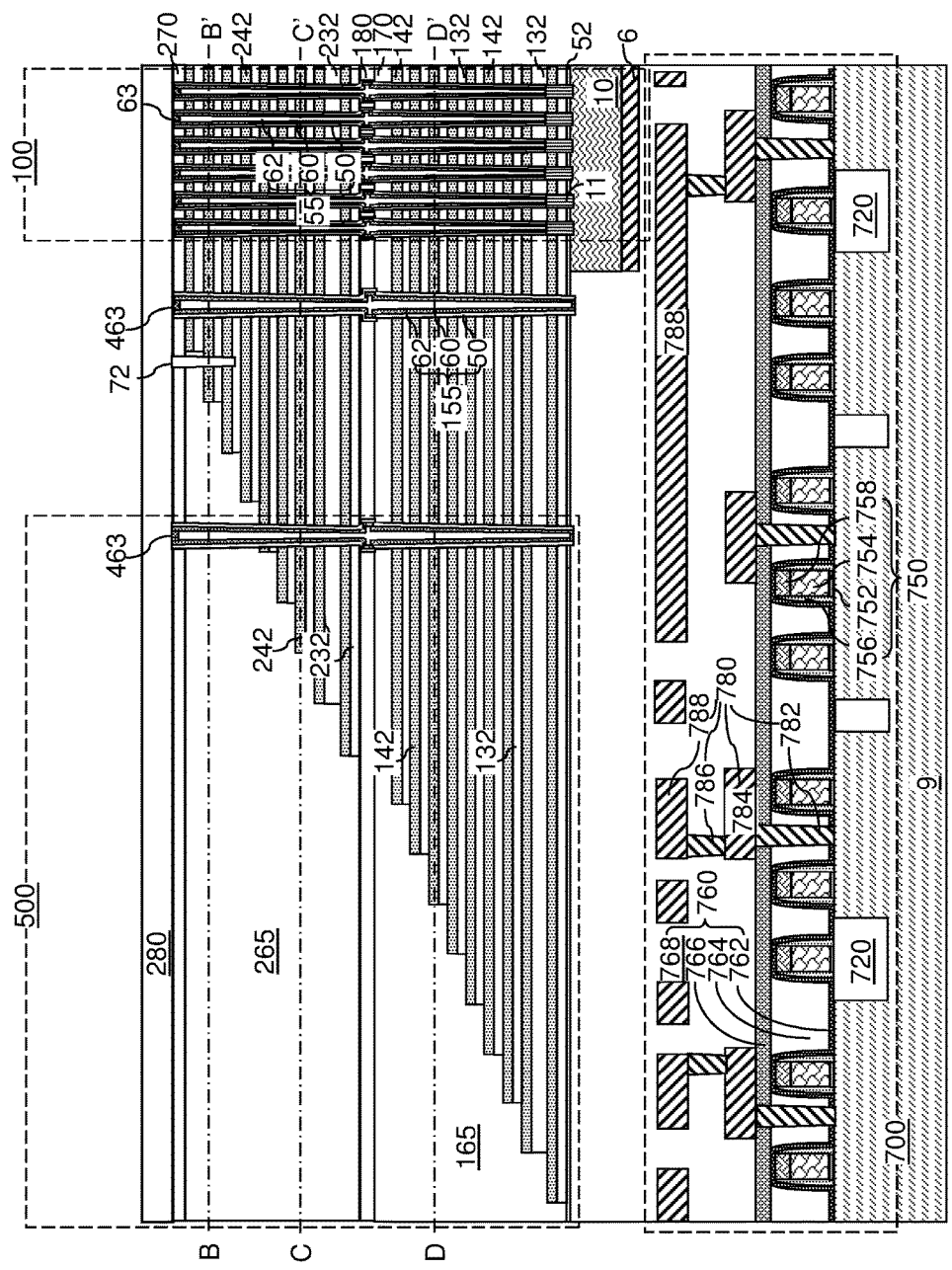
FIG. 5A is a vertical cross-sectional view of the exemplary structure after formation of drain-select-level shallow trench isolation structures and a contact level dielectric layer according to an embodiment of the present disclosure.
Figure 5B:
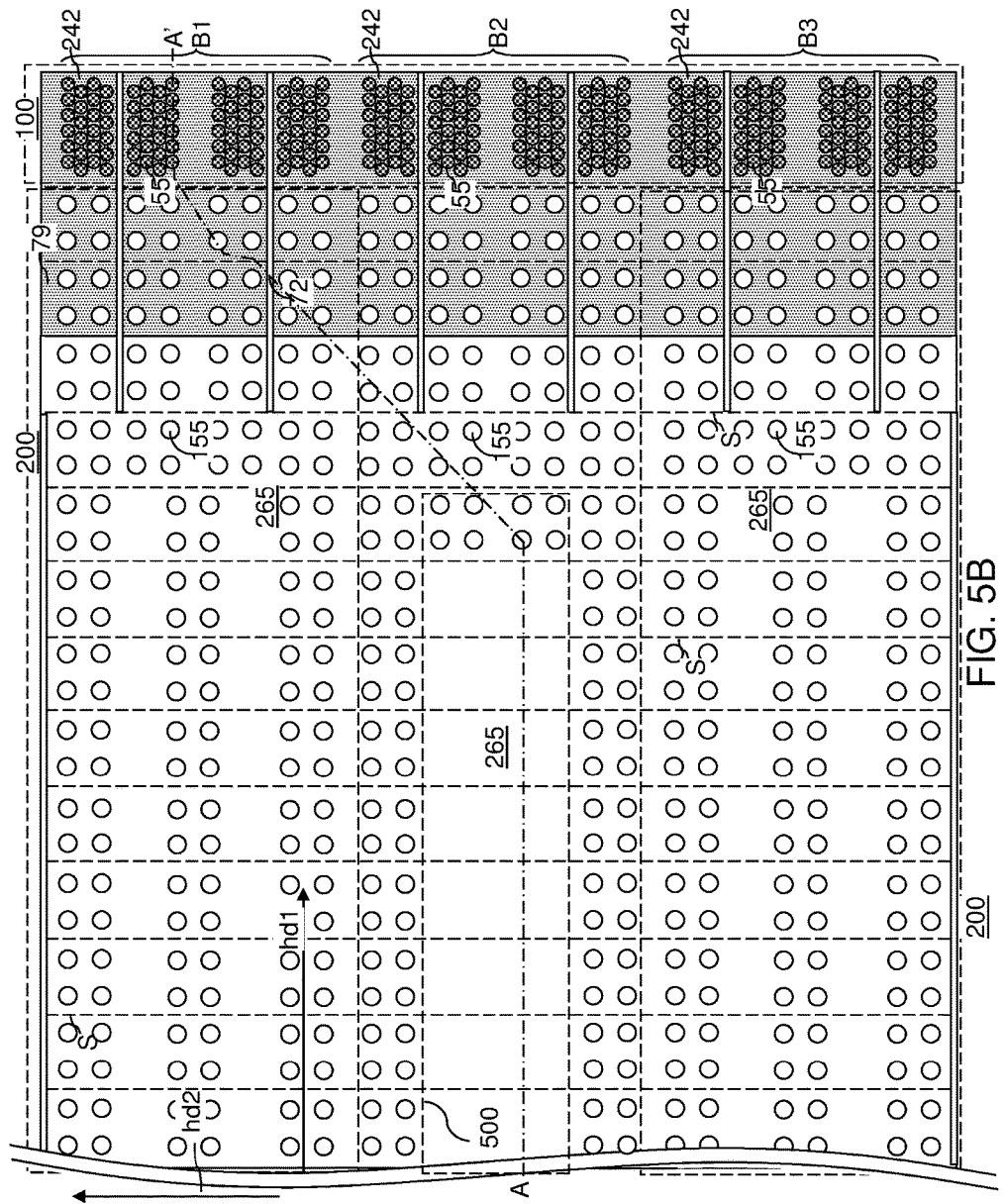
FIG. 5B is a horizontal cross-sectional view of the exemplary structure along the horizontal plane B-B' in FIG. 5A. The zig-zag vertical plane A-A' corresponds to the plane of the vertical cross-sectional view of FIG. 5A.
Figure 5D:
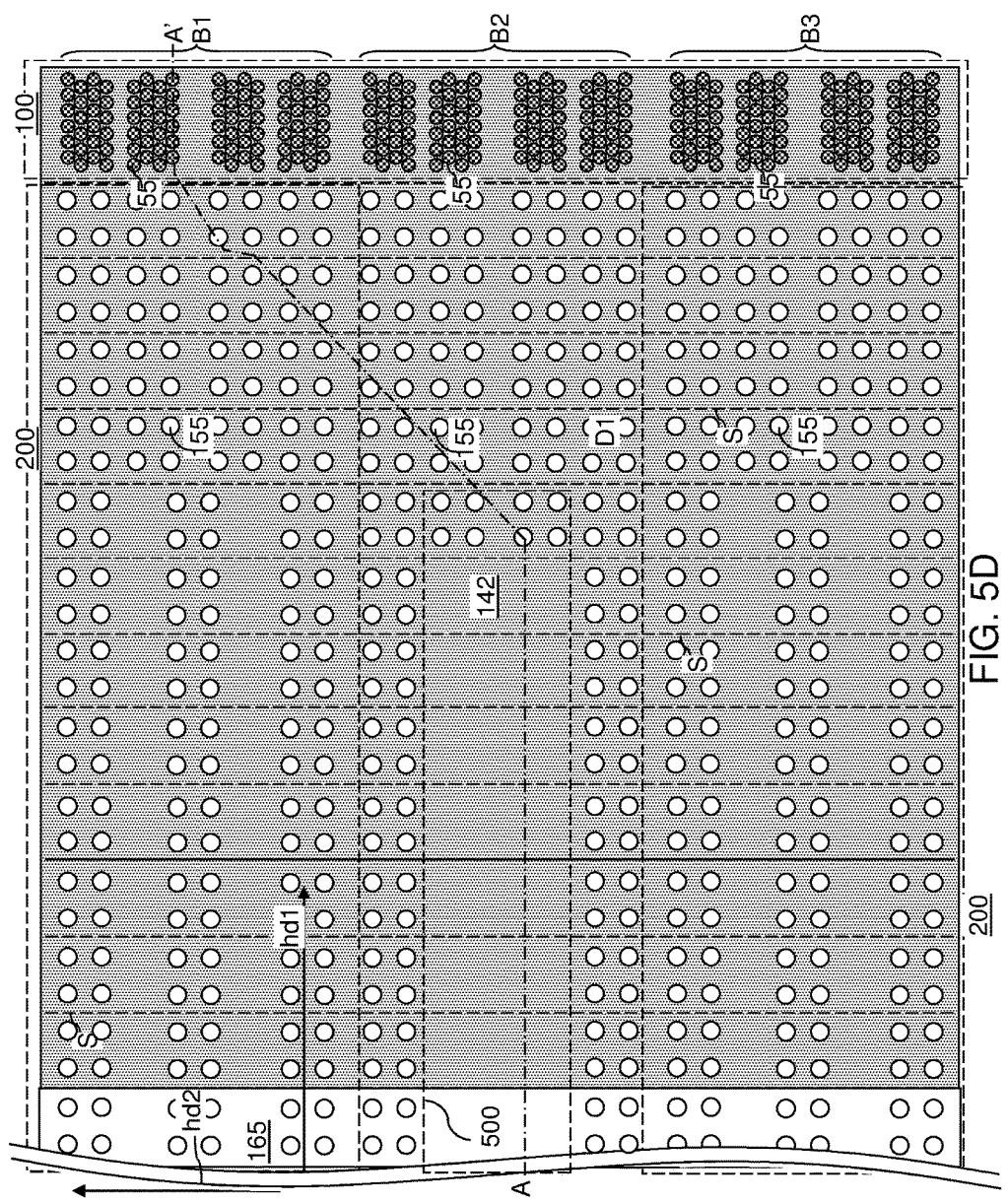
FIG. 5D is a horizontal cross-sectional view of the exemplary structure along the horizontal plane D-D' in FIG. 5A.
Figure 6A:
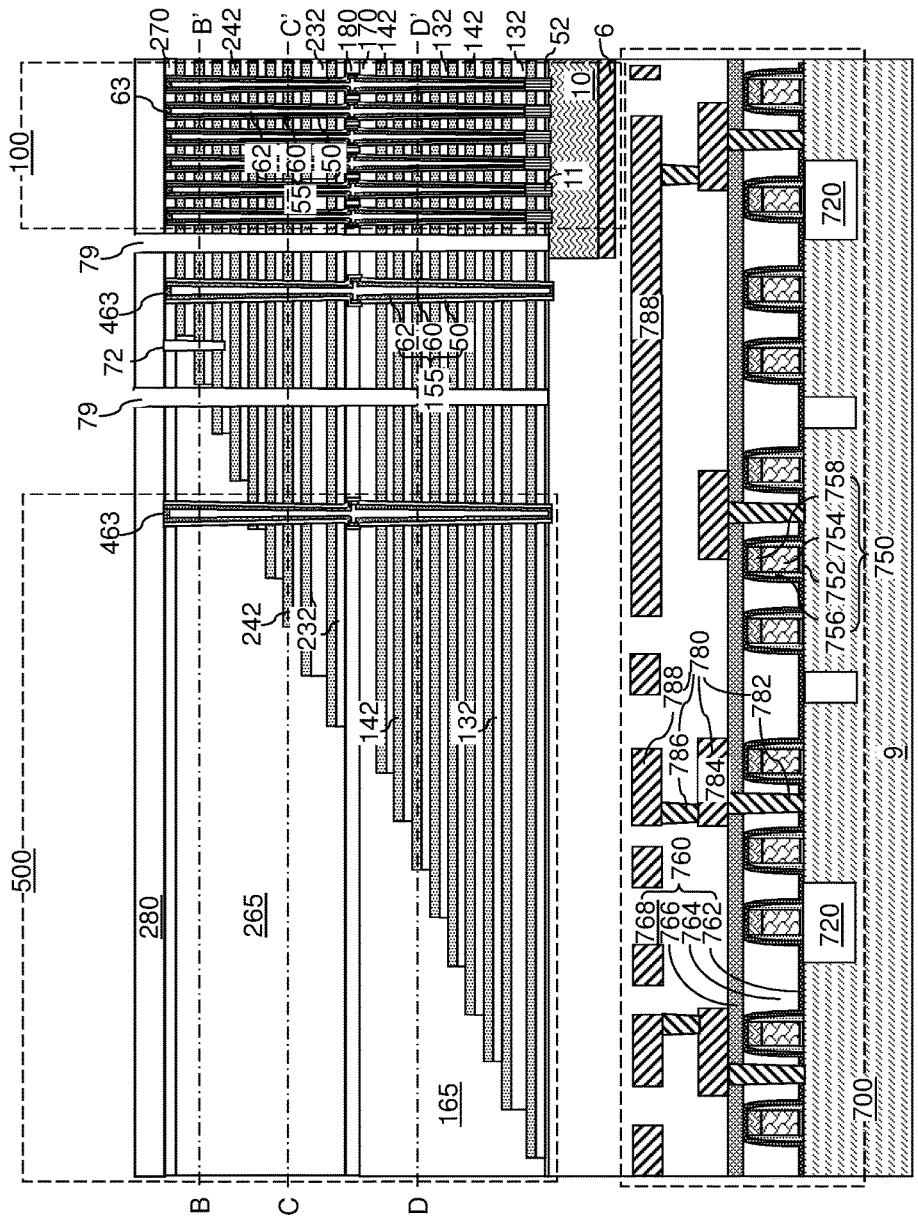
FIG. 6A is a vertical cross-sectional view of the exemplary structure after formation of backside contact trenches according to an embodiment of the present disclosure.
Figure 6B:
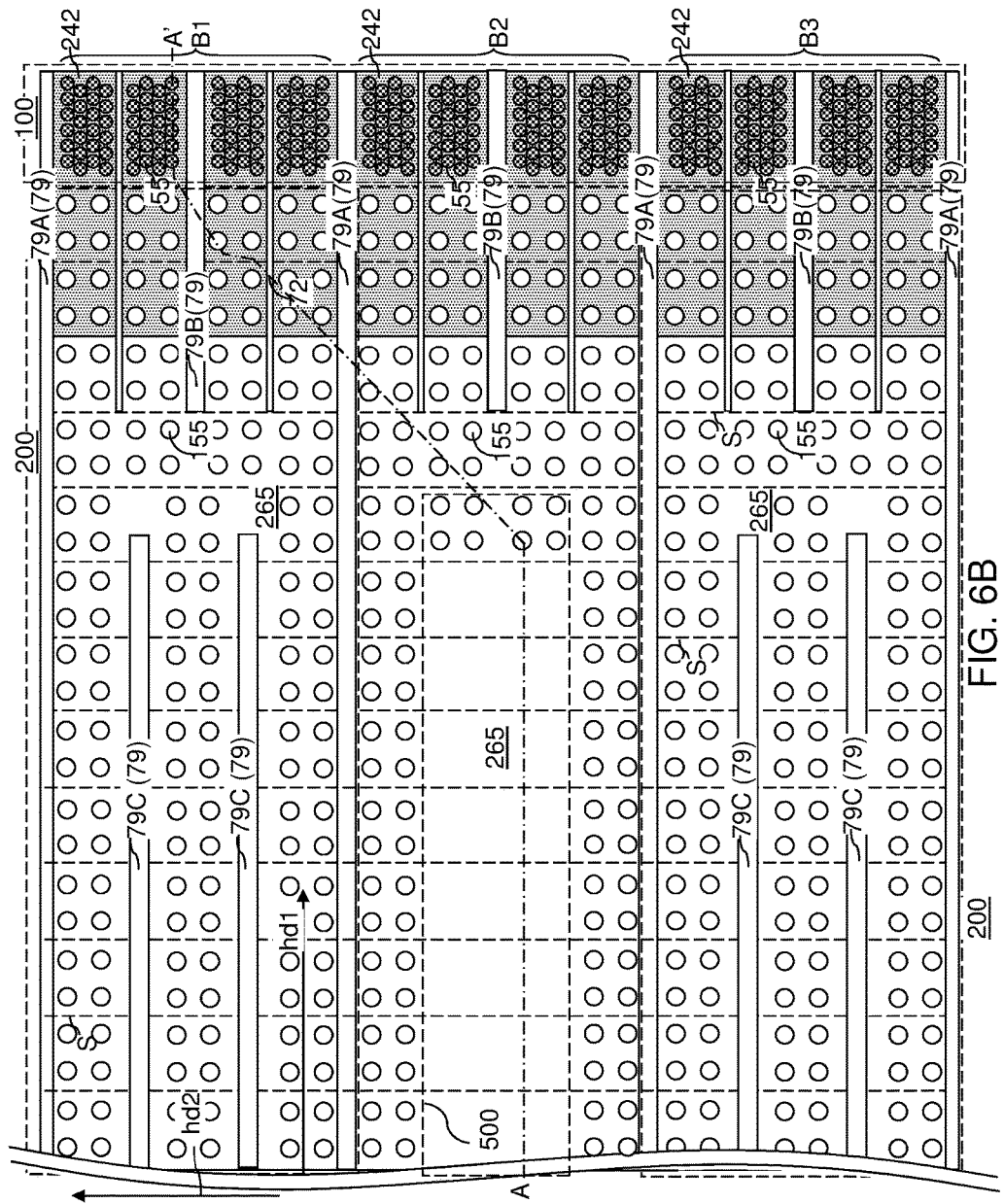
FIG. 6B is a horizontal cross-sectional view of the exemplary structure along the horizontal plane B-B' in FIG. 6A. The zig-zag vertical plane A-A' corresponds to the plane of the vertical cross-sectional view of FIG. 6A.
Figure 6C:
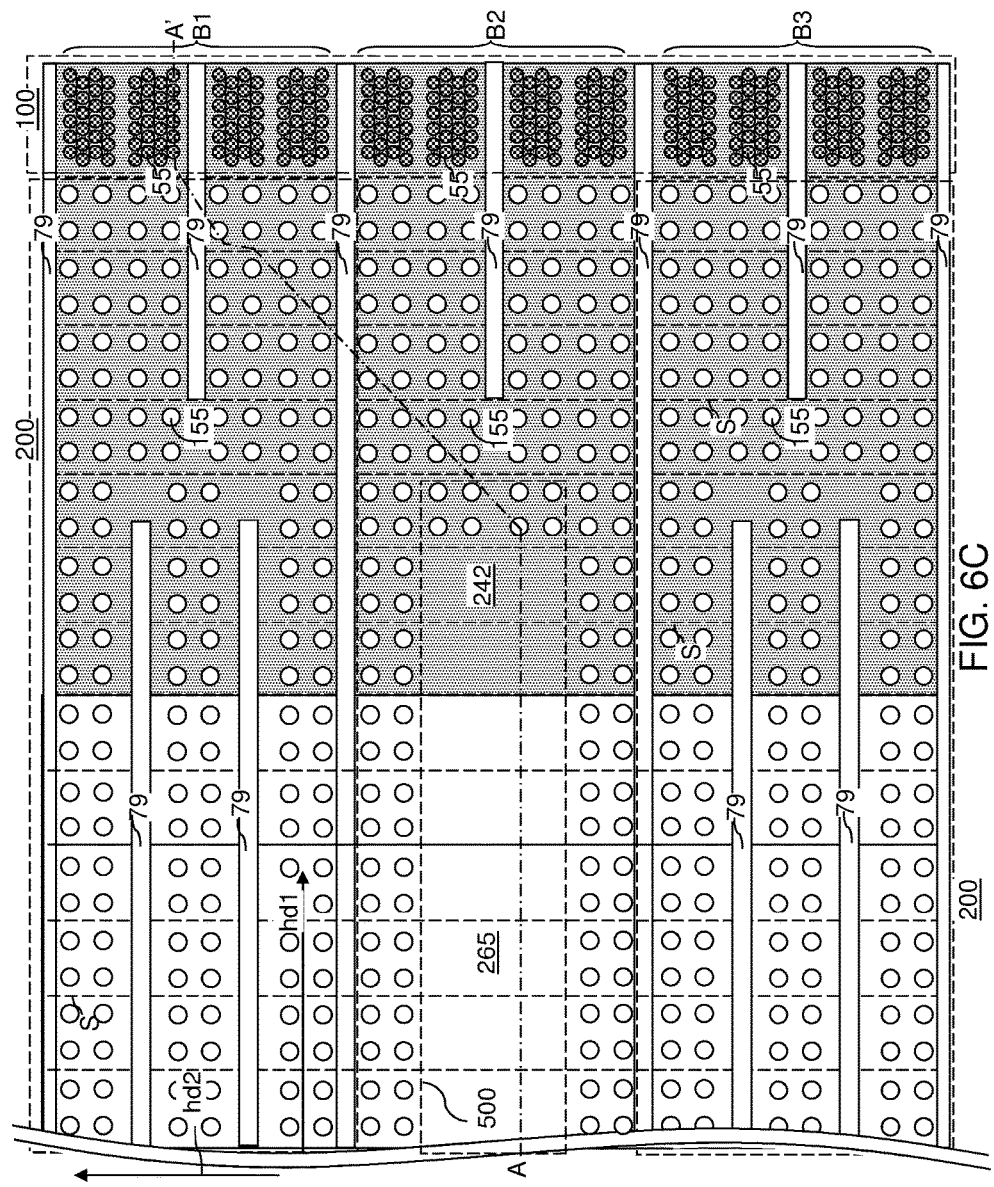
FIG. 6C is a horizontal cross-sectional view of the exemplary structure along the horizontal plane C-C' in FIG. 6A.
Figure 6D:
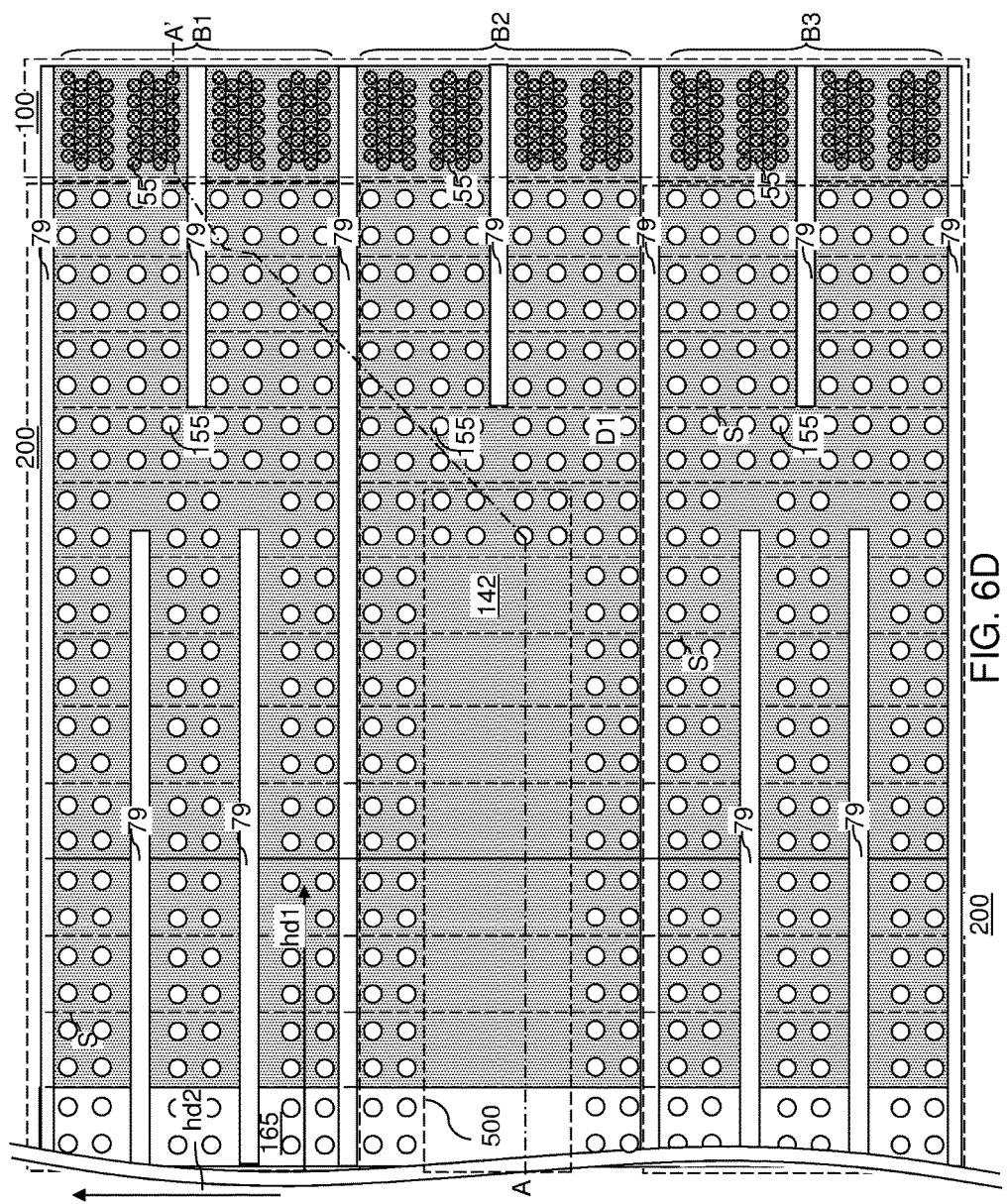
FIG. 6D is a horizontal cross-sectional view of the exemplary structure along the horizontal plane D-D' in FIG. 6A.

Referring to FIGS. 4A and 4B, pedestal channel portions 11 can be optionally formed at the bottom of each memory opening 49 by a selective semiconductor deposition process. The selective semiconductor deposition grows a semiconductor material only from semiconductor surfaces, i.e., the physically exposed surfaces of the planar semiconductor material layer 10, and suppresses growth of the semiconductor material from insulator surfaces. During a selective semiconductor deposition process, a reactant (such as silane, dichlorosilane, trichlorosilane, disilane, etc.) can be flowed into a deposition chamber simultaneously with, or alternately with, an etchant (such as hydrogen chloride). Because a semiconductor material is deposited at a greater deposition rate on semiconductor surfaces than on insulator surfaces, a selective growth can be achieved by setting the etch rate between the deposition rate of the semiconductor material on semiconductor surfaces and the deposition rate of the semiconductor material on insulator surfaces. In one embodiment, the top surfaces of the pedestal channel portions 11 can extend above source select levels in which source-select-level electrically conductive layers can be subsequently formed. Because semiconductor surfaces are not physically exposed in the support openings 149, the semiconductor material is not deposited within the support openings 149.

Memory stack structures 55 and support pillar structures 155 can be formed in the memory openings 49 and in the support openings 149, respectively, during the same deposition steps. In an illustrative example, each memory stack structure 55 and each support pillar structure 155 can include a memory film 50, a vertical semiconductor channel 60, and an optional dielectric core 62. In one embodiment, each memory film 50 can include a blocking dielectric layer 51, a memory material layer 54, and a tunneling dielectric layer 56 as illustrated in the inset. In one embodiment, each vertical semiconductor channel 60 can include a first semiconductor channel 601 and a second semiconductor channel 602.

The blocking dielectric layer 51 includes a blocking dielectric layer material such as silicon oxide, a dielectric metal oxide (such as aluminum oxide), or a combination thereof. Alternatively, the blocking dielectric layer 51 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 located at the levels of the sacrificial material layers (142, 242) that will be subsequently replaced with electrically conductive layers (e.g., word lines).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0 \times 10^7/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second insulating cap layer 270. Each remaining portion of the dielectric material in the memory openings constitutes a dielectric core 62. A doped semiconductor material having a second conductivity type (which is the opposite of the first conductivity type) can be deposited over the dielectric cores 62. Each portion of the doped semiconductor material deposited within the cavities in the memory openings forms a drain region 63. Each portion of the doped semiconductor material deposited within the cavities in the support openings forms a dummy drain region 463. The doped semiconductor material can be, for example, doped polysilicon. Excess portions of the deposited semiconductor material can be removed from above the top surface of the second insulating tier cap layer 270, for example, by chemical mechanical planarization (CMP) or a recess etch to form the drain region 63 and the dummy drain regions 63. Each remaining portion of the second semiconductor channel layer constitutes a second semiconductor channel 602.

A combination of a first semiconductor channel 601 and a second semiconductor channel 602 inside a memory opening constitutes a vertical semiconductor channel 60. Each of the memory stack structures 55 comprises a memory film 50 and a vertical semiconductor channel 60 that is adjoined to a respective horizontal channel within the planar semiconductor material layer 10. Each memory film 50 can include a blocking dielectric layer 51 contacting a sidewall of the memory opening, a plurality of charge storage regions (embodied as portions of a memory material layer 54 at each level of the sacrificial material layers (142, 242)) located on an inner sidewall of the blocking dielectric layer 51, and a tunneling dielectric layer 56 located inside the plurality of charge storage regions.

The first tier structure (132, 142, 170, 165), the second tier structure (232, 242, 270, 265), the inter-tier dielectric layer 180, and the memory stack structures 55 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Referring to FIGS. 5A-5D, a contact level dielectric layer 280 can be formed over the memory-level assembly. The contact level dielectric layer 280 is formed at a contact level through which various contact via structures are subsequently formed to the drain regions 63 and the various electrically conductive layers that replaces the sacrificial material layers (142, 242) in subsequent processing steps.

Referring to FIGS. 6A-6D, trenches are subsequently formed through the contact level dielectric layer 280 and the memory-level assembly. The trenches are formed in areas offset from the memory stack structures 55 and support pillar structures 155 for the purpose of subsequently forming contact structures therein, and thus, are herein referred to as backside contact trenches 79. For example, a photoresist layer can be applied an lithographically patterned over the contact level dielectric layer 280 to form elongated openings that extend along the first horizontal direction hd1 A subset of the openings in the patterned photoresist layer fall on the boundaries between blocks (B1, B2, B3, . . . ). An anisotropic etch is performed to transfer the pattern in the patterned photoresist layer through the contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 include a first subset 79A of backside contact trenches 79 that extend through a memory array region 100, adjoining word line contact via regions 200, and adjoining through-memory-level via regions 500. The first subset of the backside contact trenches 79 is formed through the memory-level assembly, laterally extends along the first horizontal direction hd1, and laterally divides the memory-level assembly (which generally includes at least one alternating stack (132, 142, 232, 242) into a plurality of laterally spaced-apart blocks (B1, B2, B3, . . . ).

Each block (B1, B2, B3, . . . ) includes a respective portion of the memory array region between a neighboring pair of backside contact trenches 79 among the first subset 79A of the backside contact trenches 79. Each block (B1, B2, B3, . . . ) can include the respective portion of the memory array region 100, a staircase region located on one lengthwise end of the respective portion of the memory array region 100 and including a word line contact via region 200, and another staircase region located on another lengthwise end of the respective portion of the memory array region 100 and including a through-memory-level via region 500. In one embodiment, the placement of the word line contact via regions 200 along consecutive blocks (B1, B2, B3, . . . ) can alternate between two opposite sides. In an illustrative example, every odd numbered block (B1, B3, etc.) has a respective word line contact via region 200 on one side (such as a left side), and every even numbered block (B2, B4, etc.) has a respective word line contact via region 200 on an opposite side (such as a right side). Likewise, the placement of the through-memory-level via regions 500 along consecutive blocks (B1, B2, B3, . . . ) can alternate between two opposite sides such that the through-memory-level via regions 500 do not overlap with the word line contact via regions 200. In an illustrative example, every even numbered block (B2, B4, etc.) has a respective through-memory-level via regions 500 on one side (such as the left side), and every odd numbered block (B1, B3, etc.) has a respective word line contact via region 200 on an opposite side (such as the right side).

Optionally, a second subset 79B of backside contact trenches 79 may be provided within each block (B1, B2, B3, . . . ). If employed, the second subset 79B of backside contact trenches 79 can extend along the first horizontal direction hd1, and can be positioned to suitably divide each block into a plurality of sub-blocks. If the drain-contact-level shallow trench isolation structures 72 are employed, the drain-contact-level shallow trench isolation structures 72 can extend along the first horizontal direction hd1 to divide a subset of layers in an upper portion of the second-tier alternating stack (232, 242) within each sub-block or within each block. Various design optimizations can be employed to divide a block into sub-blocks or subordinate units.

The first subset 79A of backside contact trenches 79 may extend through the array region 100 and the contact region 200. The second subset 79B of backside contact trenches 79 may be located in the array region 100 and may optionally partially extend into the contact region 200. Optionally, a third subset 79C of backside contact trenches 79 extending in the first horizontal direction hd1 may be provided within the contact region 200. Preferably, no backside contact trenches 79 are located in regions 500. In one embodiment, the third subset 79C of backside contact trenches 79 may be offset from the first and second subsets 79A and 79B of backside contact trenches 79 in at least one, and preferably both of the first or the second horizontal directions hd1, hd2. Thus, a portion of the alternating stack separates each trench 79C in the contact region 200 from the trenches 79A and 79B in the array region 100. This configuration of the backside contact trenches 79 may reduce the stress on the substrate 9.

Figure 7A:
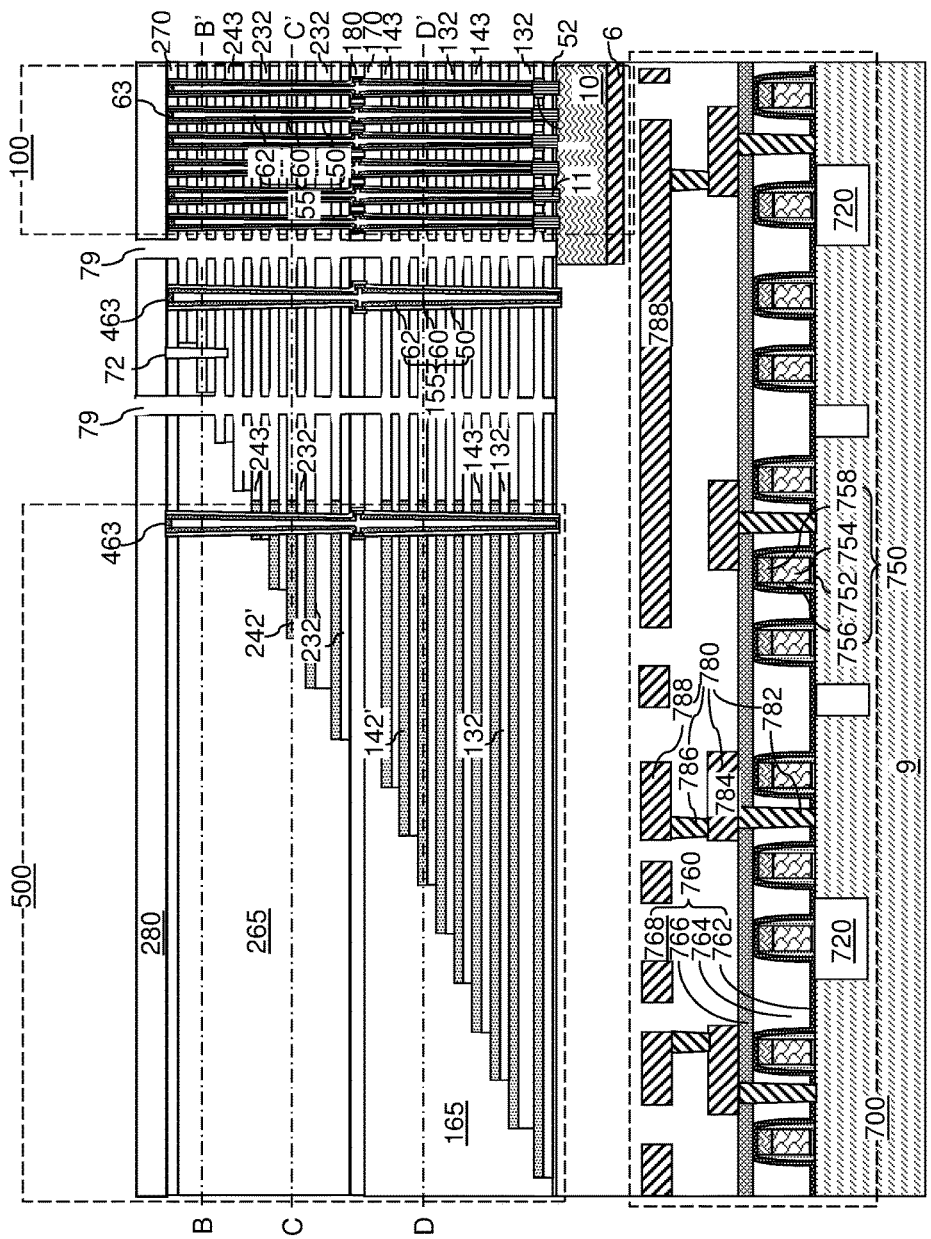
FIG. 7A is a vertical cross-sectional view of the exemplary structure after formation of backside recesses by removal of the spacer dielectric layers according to an embodiment of the present disclosure.
Figure 7B:
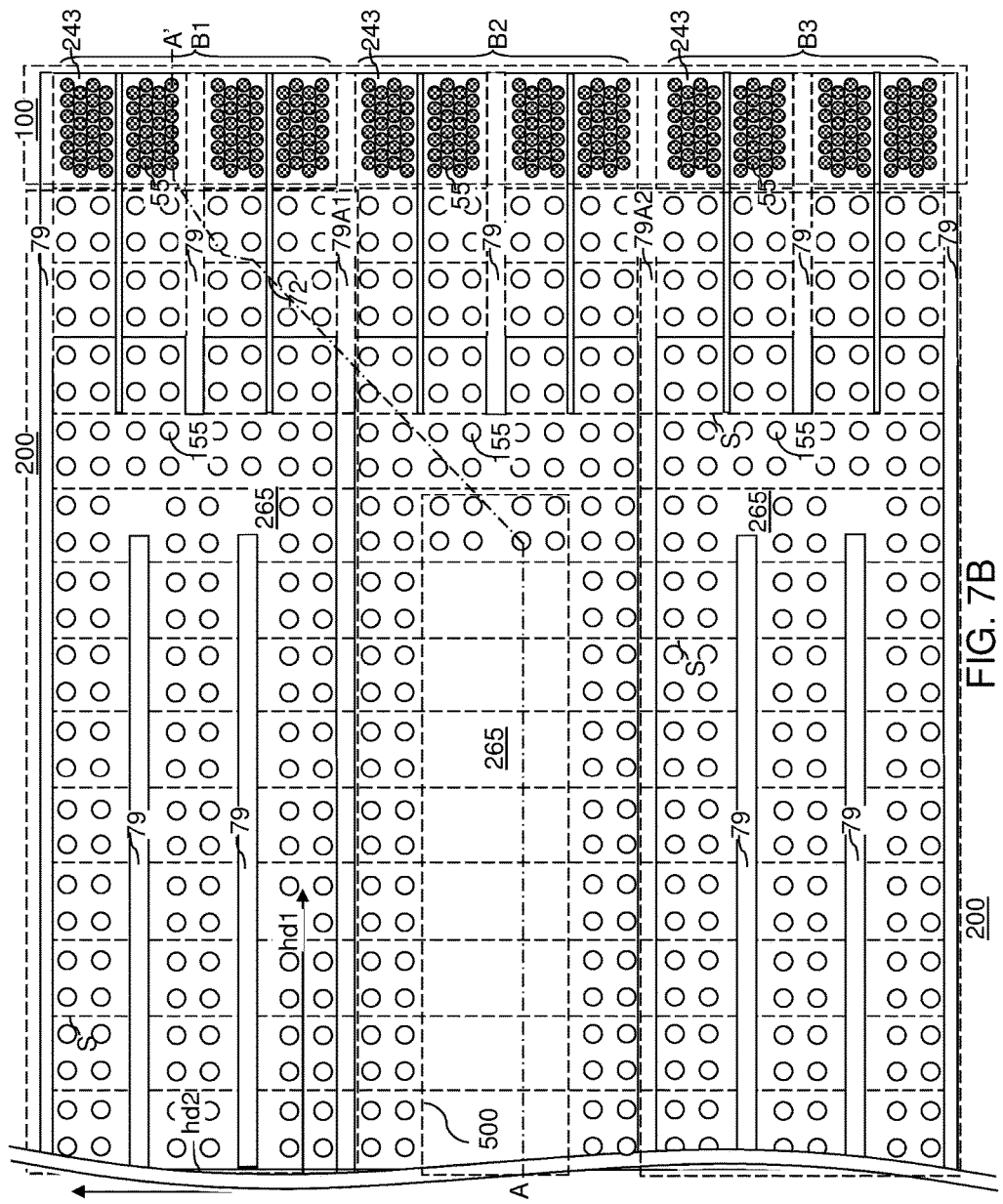
FIG. 7B is a horizontal cross-sectional view of the exemplary structure along the horizontal plane B-B' in FIG. 7A. The zig-zag vertical plane A-A' corresponds to the plane of the vertical cross-sectional view of FIG. 7A.

Referring to FIGS. 7A and 7B, portions of the spacer dielectric layers, i.e., the sacrificial material layers (142, 242), outside the through-memory-level via region 500 are etched selective to the insulating layers (132, 232) employing an etchant that is introduced through the backside contact trenches 79. Specifically, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the contact trenches 79, for example, employing an isotropic etch process. The duration of the etch process is limited so that removal of the sacrificial material layers (142, 242) is limited to a predetermined lateral distance from sidewalls of the contact trenches 79. Thus, portions of the spacer dielectric layers, such as the sacrificial material layers (142, 242), located outside the through-memory-level via region 500 are removed selective to the insulating layers (132, 232). Since the contact trenches 79 do not extend into region 500 and are preferably offset from the edges of region 500 by a distance, the sacrificial material layers (142, 242) in region 500 are not etched during the timed recess etched.

First lateral recesses 143 are formed in volumes from which the first sacrificial material layers 142 are removed. Second lateral recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide.

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art.

Each of the first and second lateral recesses (143, 243) can be a laterally extending cavity having a lateral dimension that is greater than the vertical extent of the cavity. In other words, the lateral dimension of each of the first and second lateral recesses (143, 243) can be greater than the height of the respective lateral recess (143, 243). A plurality of first lateral recesses 143 can be formed in the volumes from which the material of the first sacrificial material layers 142 is removed. A plurality of second lateral recesses 243 can be formed in the volumes from which the material of the second sacrificial material layers 242 is removed. Each of the first and second lateral recesses (143, 243) can extend substantially parallel to the top surface of the substrate 10. A lateral recess (143, 243) can be vertically bounded by a top surface of an underlying insulating layer (132 or 232) and a bottom surface of an overlying insulating layer (132 or 232). In one embodiment, each of the first and second lateral recesses (143, 243) can have a uniform height throughout.

Portions of the sacrificial material layers (142, 242) are removed selective to the insulating layers (132, 232) within the lateral etch distance from sidewalls of the contact trenches 79 to form the first and second lateral recesses (143, 243). Each of the sacrificial material layers (142, 242) can be spacer dielectric layers as discussed above. Remaining portions of the sacrificial material layers (142, 242) within the at least one alternating stack are therefore spacer dielectric materials, and are herein referred to as spacer dielectric layers (142', 242'). The spacer dielectric layers (142', 242') include first spacer dielectric layers 142' that are remaining portions of the first sacrificial material layers 142, and second spacer dielectric layers 242' that are remaining portions of the second sacrificial material layers 242. It is understood that the first spacer dielectric layers 142' and the second spacer dielectric layers 242' as used hereafter refer to remaining portions of the first spacer layers 142 and the second spacer layers 242 as provided in the processing steps of FIGS. 2A, 2B, 3A, and 3B.

Figure 7C:
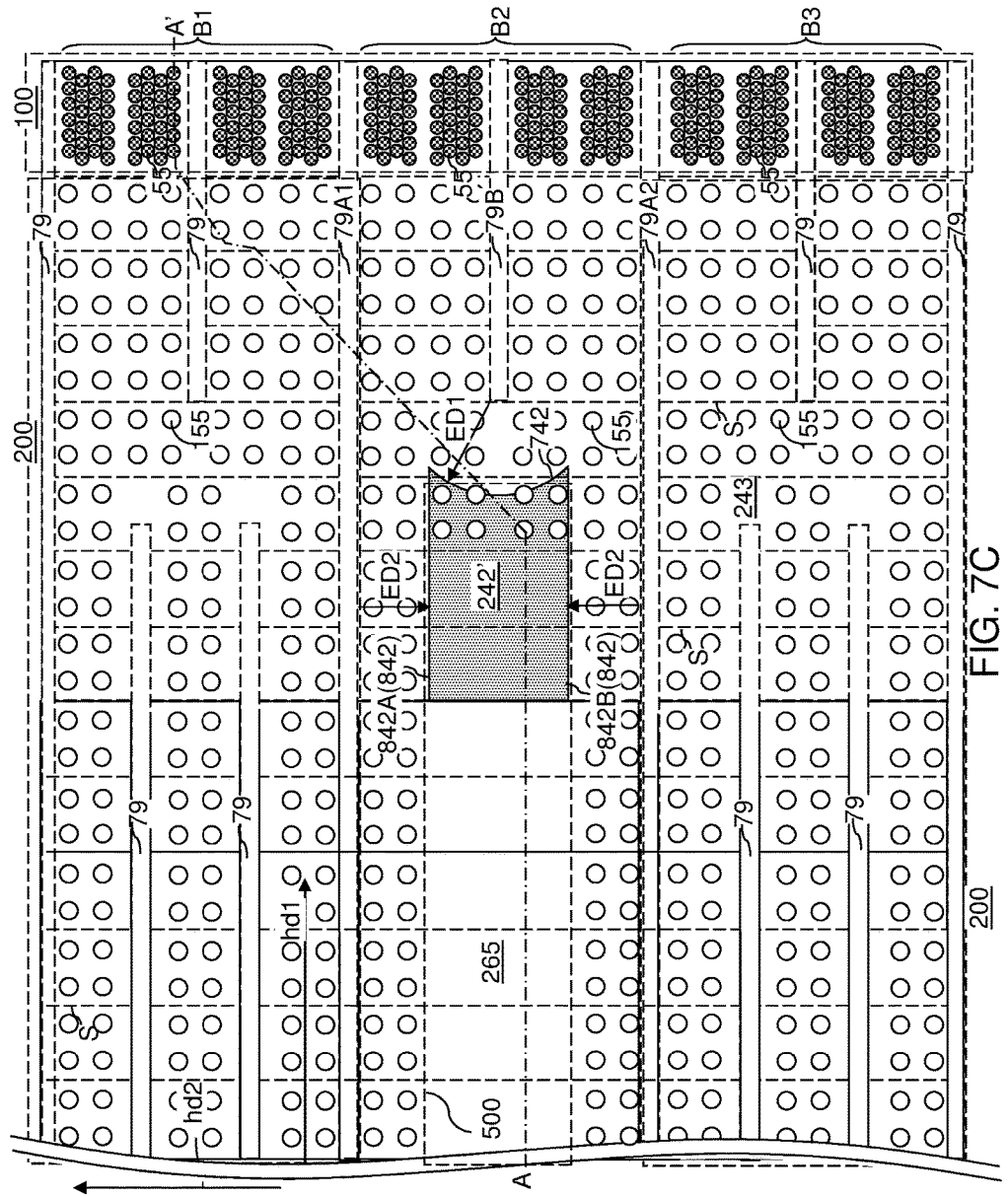
FIG. 7C is a horizontal cross-sectional view of the exemplary structure along the horizontal plane C-C' in FIG. 7A.
Figure 7D:
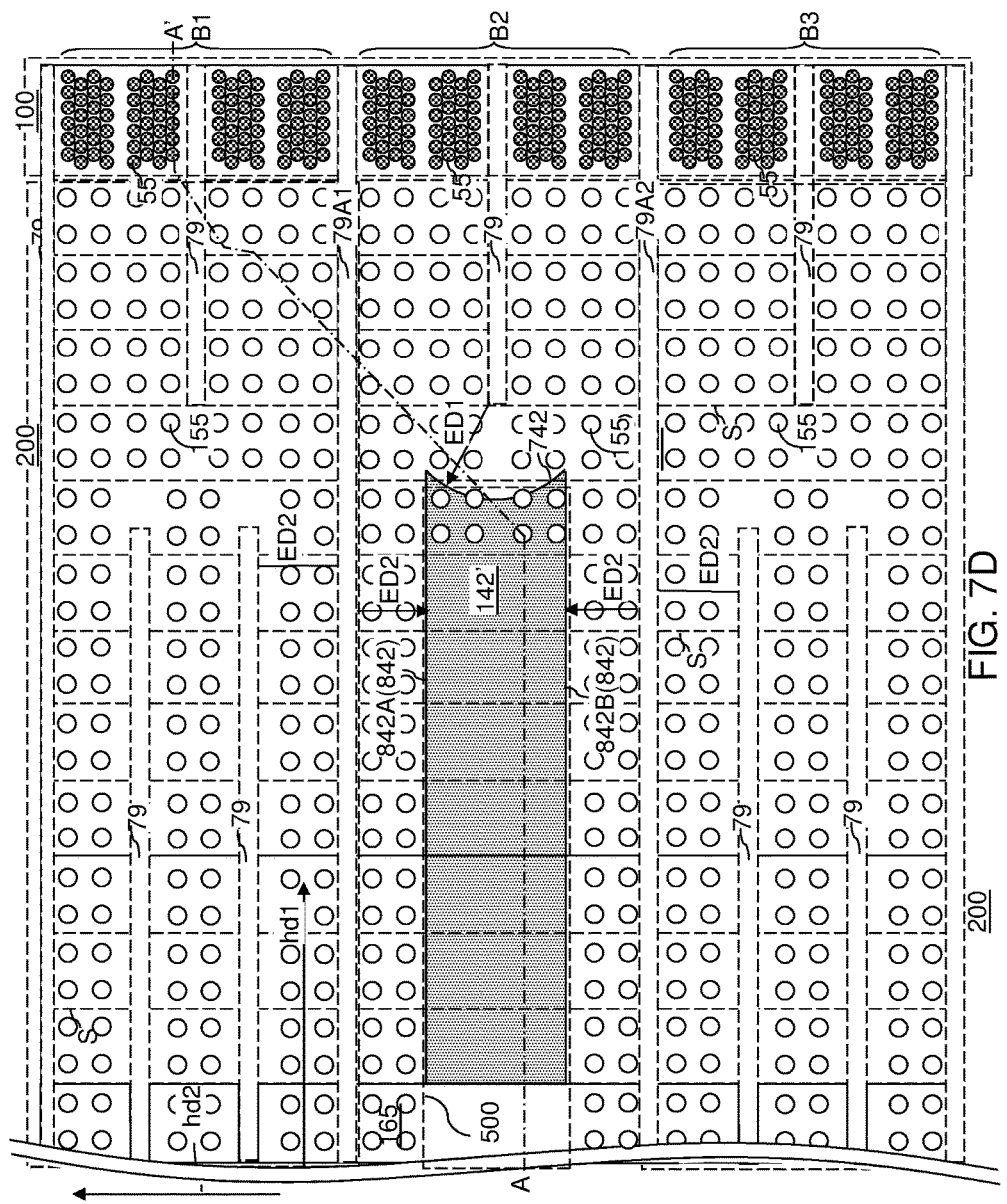
FIG. 7D is a horizontal cross-sectional view of the exemplary structure along the horizontal plane D-D' in FIG. 7A.
Figure 8A:
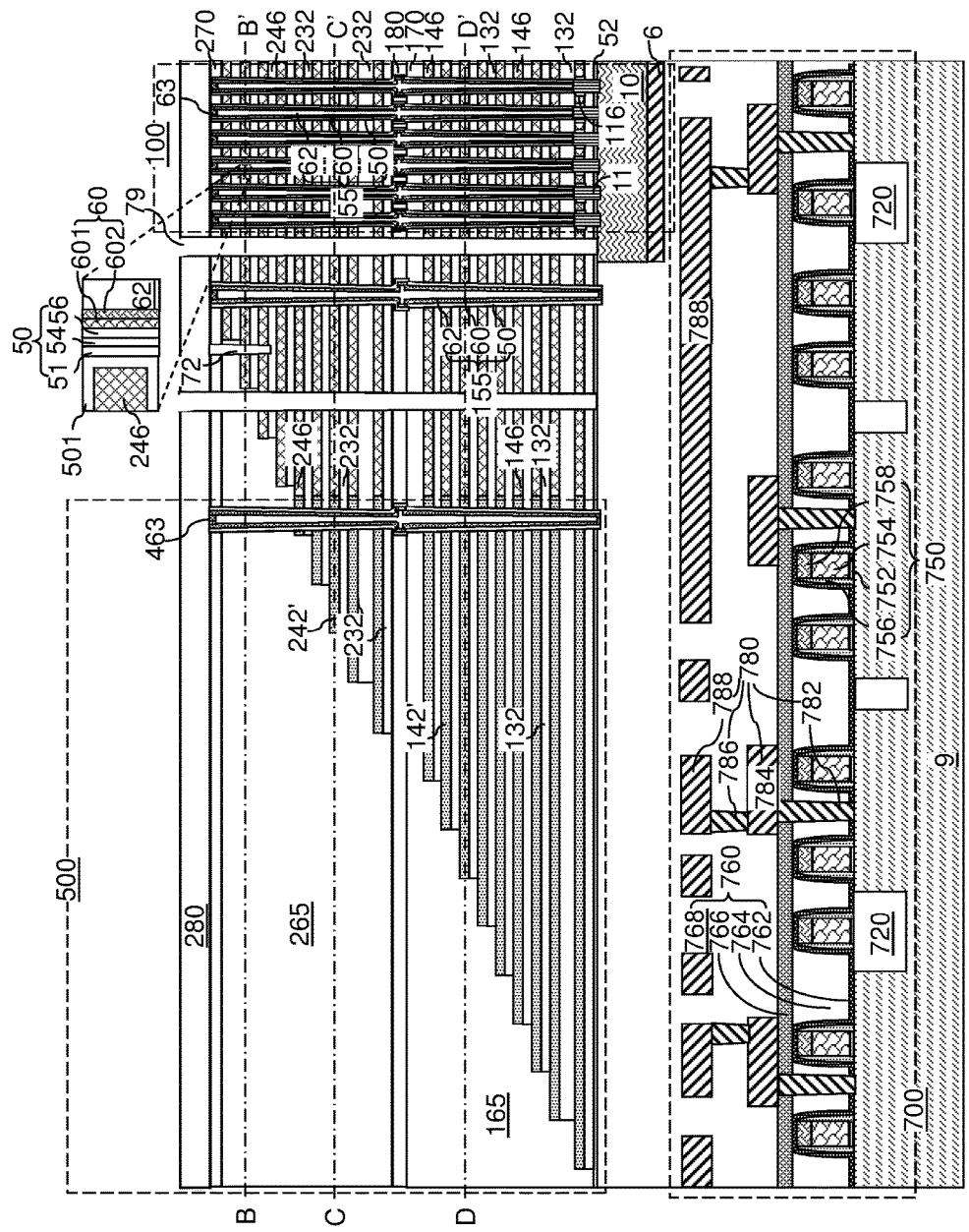
FIG. 8A is a vertical cross-sectional view of the exemplary structure after formation of electrically conductive layers in the backside recesses according to an embodiment of the present disclosure.
Figure 8C:
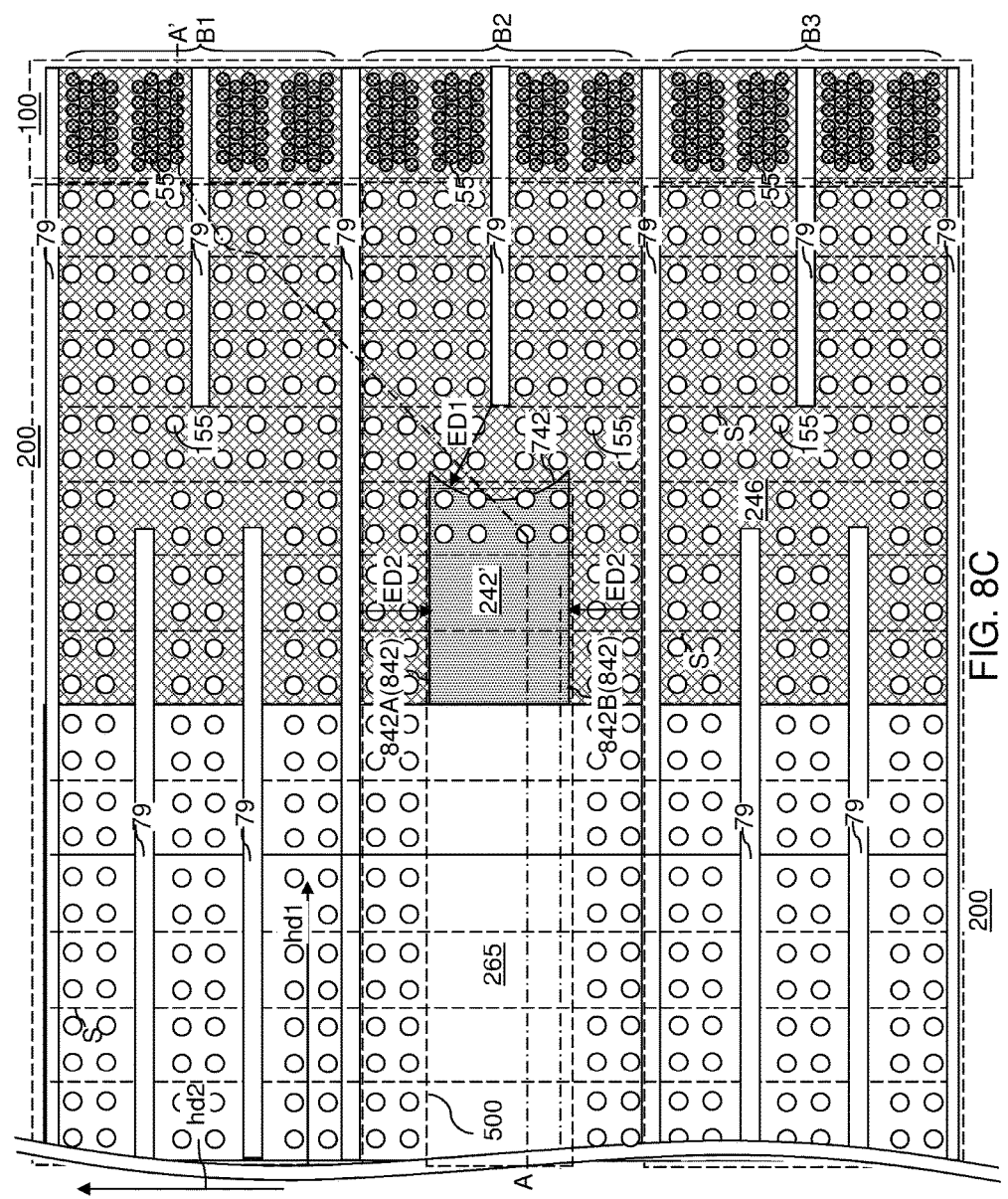
FIG. 8C is a horizontal cross-sectional view of the exemplary structure along the horizontal planeC-C' in FIG. 8A.
Figure 8D:
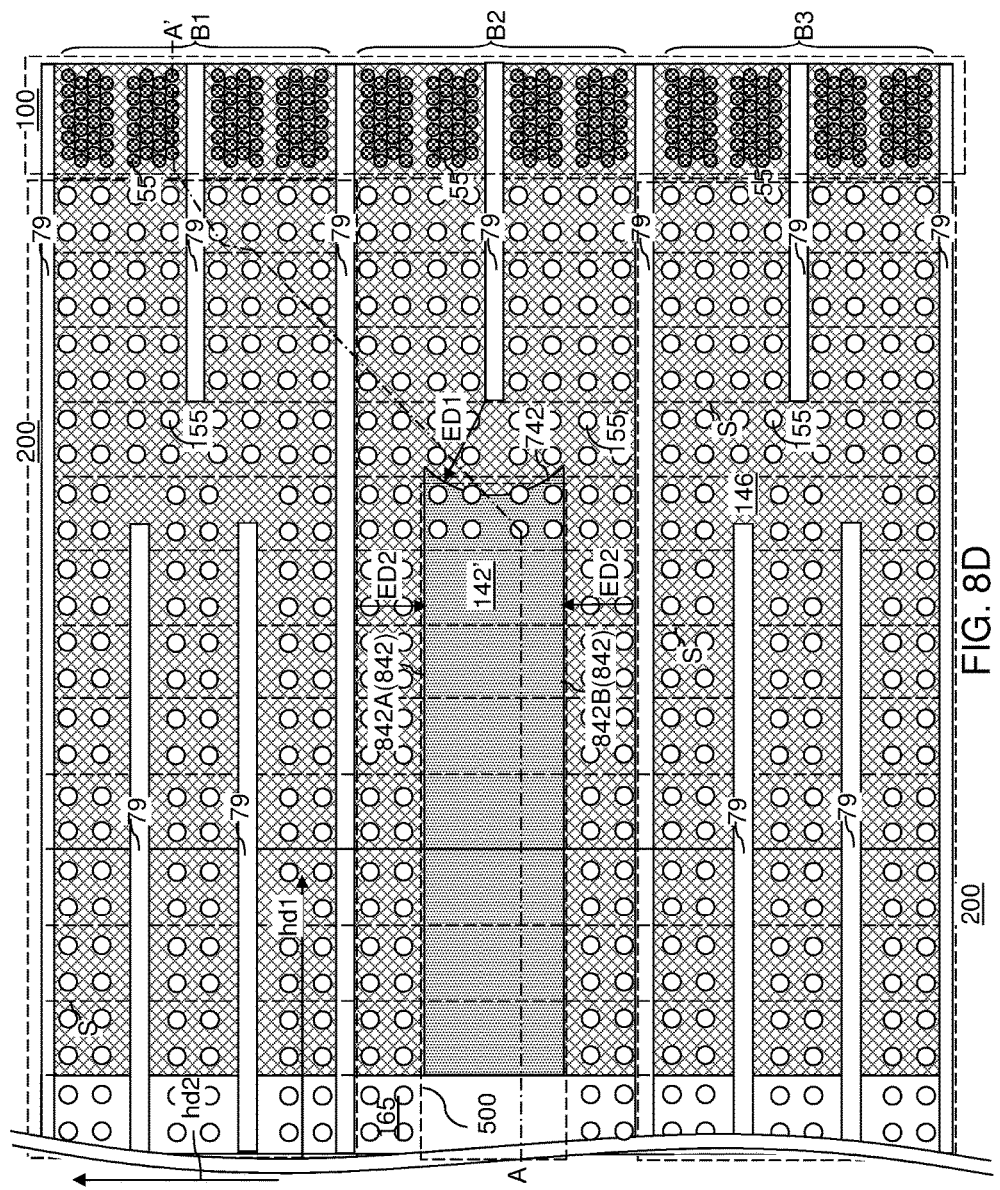
FIG. 8D is a horizontal cross-sectional view of the exemplary structure along the horizontal planeD-D' in FIG. 8A.

Each of the spacer dielectric layers (142', 242') has a concave sidewall 742 this is substantially equidistant from a most proximal sidewall of an end or tip of a contact trench 79 that located closest to a respective through-memory-stack via region 500 (such as the contact trench 79A dividing the second block B2 from the third block B3 or trench 79B located in block B2), as shown in FIGS. 7C and 7D. As used herein, first elements are "substantially equidistant from" second elements if variations among the distances between the first elements and the second elements are within 5%. The variations among the lateral distance between sidewalls of the spacer dielectric layers (142', 242') and the respective most proximal sidewalls of the contact trenches 79 can be due to the presence of the support pillar structures 155, which prevent etching of the sacrificial material layers (142, 242) along straight lines intersected by the support pillar structures 155. The average distance between the concave sidewall 742 and the respective most proximal sidewall (e.g., end or tip sidewall) of the contact trenches 79 is herein referred to as a first etch distance ED1.

The concave sidewalls 742 of different spacer dielectric layers (142', 242') can be "substantially vertical." As used herein, a surface is "substantially vertical" if the surface is vertical or deviates from a vertical line by less than 5 degrees. Further, the concave substantially vertical sidewalls 742 of the spacer dielectric layers (142, 242) in the remaining portion of the at least one alternating stack (132, 242, 232, 242) can be vertically coincident among one another. As used herein, two surfaces are "vertically coincident" if the two surfaces are within a same substantially vertical surface that can be generated by vertically translating a line located within a horizontal plane, or by translating a line located within a horizontal plane along a direction that does not deviate from the vertical direction by more than 5 degrees. In one embodiment, the concave substantially vertical sidewalls of the spacer dielectric layers are substantially equidistant from a respective most proximal trench among the backside contact trenches 79.

The spacer dielectric layers (142', 242') has respective pairs of substantially parallel straight sidewalls 842 that are substantially equidistant from a most proximal sidewall of contact trenches 79 that are laterally spaced from the through-memory-stack via region 500 (such as the contact trenches 79A1 and 79A2 in the contact region 200 closest to the side of region 500). All sidewalls of the spacer dielectric layers (142', 242') can be substantially equidistant from a most proximal sidewall of the contact trenches (79A1, 79A2) by a second etch distance ED2, which is substantially the same as the first etch distance ED1.

In one embodiment, the spacer dielectric layers (142', 242') can include first planar substantially vertical sidewalls 842A that are vertically coincident among one another and are laterally offset from a first backside contact trench 79A1 among the backside contact trenches 79 by a same lateral offset distance, i.e., the second etch distance ED2. Further, the spacer dielectric layers (142', 242') can include second planar substantially vertical sidewalls 842B that are vertically coincident among one another and are laterally offset from a second backside contact trench 79A2 among the backside contact trenches 79 by the same lateral offset distance. In one embodiment, the first etch distance ED1 can be the substantially the same as the second etch distance ED2. In this case, the concave substantially vertical sidewalls 742 of the spacer dielectric layers (142', 242') can be laterally spaced from the respective most proximal trench by substantially the same lateral offset distance.

In one embodiment, a sidewall surface of each pedestal channel portion 11 can be physically exposed at each bottommost first lateral recess 143 after removal of portions of the first and second sacrificial material layers (142, 242). Further, a top surface of the planar semiconductor material layer 10 can be physically exposed at the bottom of each contact trench 79. An annular dielectric spacer (not shown) can be formed around each pedestal channel portion 11 by oxidation of a physically exposed peripheral portion of the pedestal channel portions 11. Further, a semiconductor oxide potion (not shown) can be formed from each physically exposed surface portion of the planar semiconductor material layer 10 concurrently with formation of the annular dielectric spacers.

In one embodiment, the backside contact trenches 79 extend along a first horizontal direction hd1, and each through-memory-level via region 500 is laterally spaced farther from each of the backside contact trenches 79 by the a threshold lateral distance, which can be the lesser of the first etch distance ED1 and the second etch distance ED2. In one embodiment, each of the first etch distance ED1 and the second etch distance can be within 2.5% of the average of the first etch distance ED1 and the second etch distance. In another embodiment, each of the first etch distance ED1 and the second etch distance can be within 1.0% of the average of the first etch distance ED1 and the second etch distance.

In one embodiment, the through-memory-level via regions 500 can be located adjacent to every other block, and the remaining portions (132, 142', 232, 242') of the at least one alternating stack (132, 142, 232, 242) can be located in each of the through-memory-level via regions 500. For example, if the through-memory-level via region 500 adjoins the second block B2, a remaining portion (132, 142', 232, 242') of the at least one alternating stack (132, 142, 232, 242) can adjoin the second block B2, and can be laterally offset from the second block B2 along the first horizontal direction hd1, i.e., located on a sidewall of the second block B2 including alternating stacks of insulating layers (132, 232) and lateral recesses (143, 243).

Referring to FIGS. 8A-8D, a backside blocking dielectric layer 501 can be optionally deposited in the backside recesses (143, 243) and the backside contact trenches 79 and over the contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside contact trench 79, and over the contact level dielectric layer 280. The at least one conductive material can include at least one metallic material, i.e., an electrically conductive material that includes at least one metallic element.

Electrically conductive layers (146, 246) are formed by depositing a conductive material in the lateral recesses (143, 243) employing a reactant introduced through the backside contact trenches 79. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside contact trench 79 and over the contact level dielectric layer 280. Thus, the first and second sacrificial material layers (142, 242) can be replaced with the first and second conductive material layers (146, 246), respectively. Specifically, each first sacrificial material layer 142 can be replaced with a portion of the optional backside blocking dielectric layer and a first electrically conductive layer 146, and each second sacrificial material layer 242 can be replaced with a portion of the optional backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the contact level dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure. Thus, portions of the spacer dielectric layers (142, 242) outside the through-memory-level via region 500 are replaced with the electrically conductive layers (146, 246) while the through-memory-level via region 500 of the at least one alternating stack (132, 142, 232, 242) remains intact to provide a remaining portion (132, 142', 232, 242') of the at least one alternating stack (132, 142, 232, 242). The electrically conductive layers (146, 246) constitute word lines for the memory stack structures 55.

A subset of the second electrically conductive layers 246 located at the levels of the drain-select-level shallow trench isolation structures 72 constitutes drain select gate electrodes. A subset of the first electrically conductive layers 146 located at each level of the annular spacer dielectrics 116 constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the semiconductor substrate 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

In one embodiment, each of the concave substantially vertical sidewalls 742 of the spacer dielectric layers 142', 242' contacts, or is uniformly spaced (by a conformal backside blocking dielectric layer 501) from, a respective convex substantially vertical sidewall 742 of the electrically conductive layers (146, 246).

Referring to FIGS. 9A-9D, dopants of a second conductivity type, which is the opposite of the first conductivity type of the planar semiconductor material layer 10, can be implanted into a surface portion of the substrate semiconductor layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the contact level dielectric layer 280 by a planarization process such as chemical mechanical planarization or a recess etch. The backside contact via structures are electrically insulated in all lateral directions, and are laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at lest by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the contact level dielectric layer 280. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

The plurality of laterally-elongated contact via structures 76 laterally extends along the first horizontal direction hd1 and laterally divides the at least one alternating stack (132, 146, 232, 246) into a plurality of laterally spaced-apart blocks (B1, B2, B3, . . . ), wherein the plurality of blocks comprises a set of three neighboring blocks including, in order, a first block B1, a second block B2, and third block B3 arranged along a second horizontal direction hd2 that is perpendicular to the first horizontal direction hd1 and including a first staircase region (such as the word line contact via region 200) in the first block B1, a second staircase region (such as the through-memory-level via region 500) in the second block B2, and a third staircase region (as the word line contact via region 200), respectively. The contact via structures 76 are located in regions 100 and 200. However, structures 76 are not located in region 500 and are offset from the region 500.

In one embodiment, a first subset 76A of the plurality of laterally-elongated contact via structures 76 laterally divides the at least one alternating stack (132, 146, 232, 246) into a plurality of laterally spaced-apart blocks (B1, B2, B3). The plurality of blocks comprises a set of three neighboring blocks including, in order, a first block B1, a second block B2, and third block B3 arranged along a second horizontal direction hd2 that is perpendicular to the first horizontal direction hd1.

In an illustrative example, the plurality of blocks can comprise a set of three neighboring blocks (B1, B2, B3) including, in order, a first block B1, a second block B2, and third block B3 arranged along a second horizontal direction hd2 that is perpendicular to the first horizontal direction hd1. The first block B1, the second block B2, and the third block B3 can include a first staircase region (such as the region of the word line contact via region 200), a second staircase region (such as the region of the through-memory-level via region 500), and a third staircase region (that is a replica of the word line contact via region 200), respectively. As discussed above, a neighboring pair of an odd-numbered block and an even-numbered block (such as B1 and B2) can be periodically repeated along the second horizontal direction.

In one embodiment, concave substantially vertical sidewalls 742 of the spacer dielectric layers (142', 242') are vertically coincident among one another. In one embodiment, the concave substantially vertical sidewalls 742 of the spacer dielectric layers (142', 242') are substantially equidistant from a respective most proximal trench among the backside contact trenches 79.

In one embodiment, a second subset 76B of the plurality of laterally-elongated contact via structures 76 comprises at least one laterally-elongated contact via structures 76 located between a pair of laterally-elongated contact via structures 76A in the first subset 76A. At least two concave substantially vertical sidewall 742 of the at least one second alternating stack (132, 142', 232, 242') contact at least two convex substantially vertical sidewalls of the second block B2 at substantially vertical interfaces. In one embodiment, a third subset 76C of the plurality of laterally-elongated contact via structures 76 is located in regions 200, and offset from regions 500.

In one embodiment, each of the at least one second alternating stack (132, 142', 232, 242') includes stepped surfaces that contact bottom surfaces and sidewall surfaces of a respective retro-stepped dielectric material portion (265 or 165).

In one embodiment, the at least one second alternating stack (132, 142', 232, 242') has a first planar substantially vertical sidewall 842 and a second planar substantially vertical sidewall 842 that laterally extend along the first horizontal direction hd1 and laterally spaced apart by a width of the at least one second alternating stack (132, 142', 232, 242') along the second horizontal direction hd2 that is perpendicular to the first horizontal direction hd1. In one embodiment, each of the first planar substantially vertical sidewall 842 and the second planar substantially vertical sidewall 842 can be laterally spaced from a respective most proximal laterally-elongated contact via structure selected from the third subset 76C of laterally-elongated contact via structures 76 in adjacent region 200 by a substantially same lateral offset distance, such as the sum of the second etch distance ED2 and the thickness of an insulating spacer 74 that has a uniform thickness throughout.

Figure 9A:
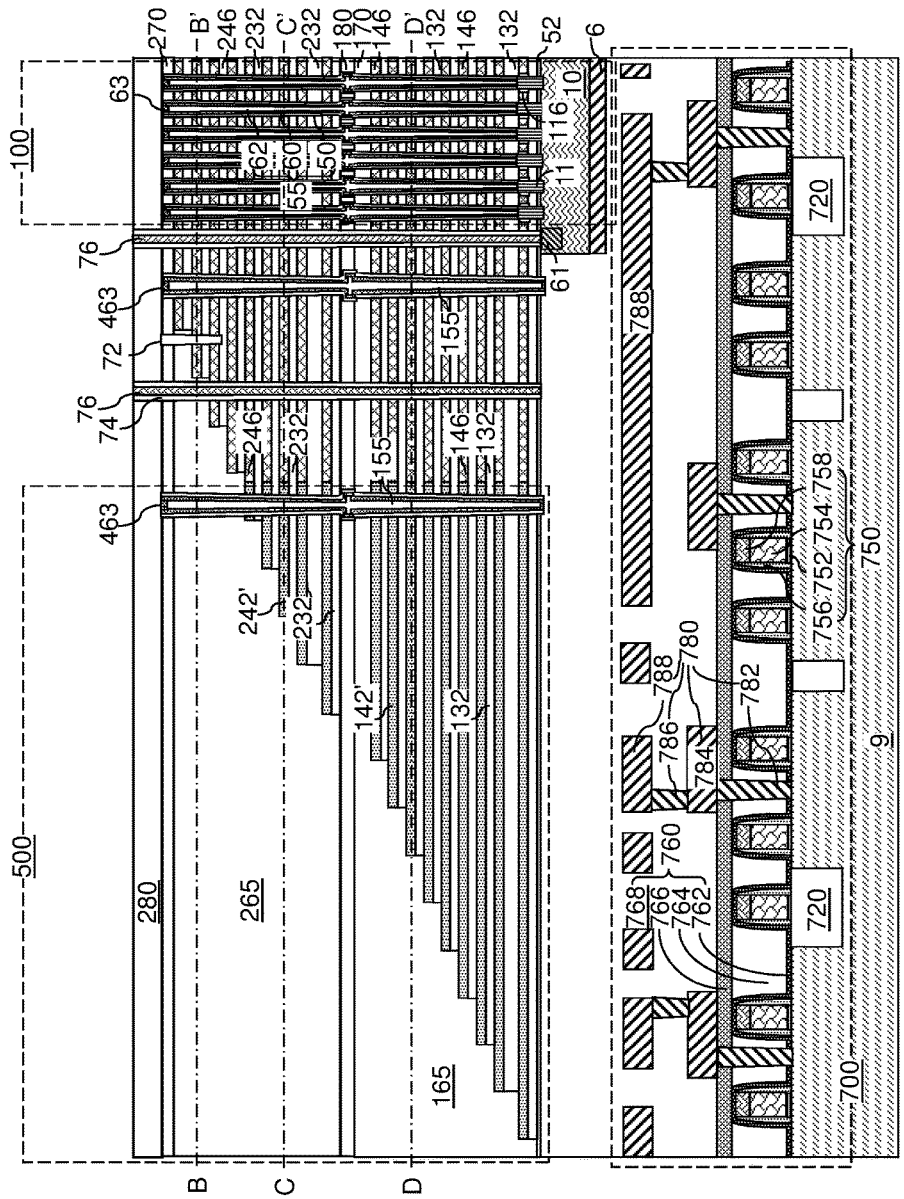
FIG. 9A is a vertical cross-sectional view of the exemplary structure after formation of insulating spacers and backside contact structures according to an embodiment of the present disclosure.
Figure 9B:
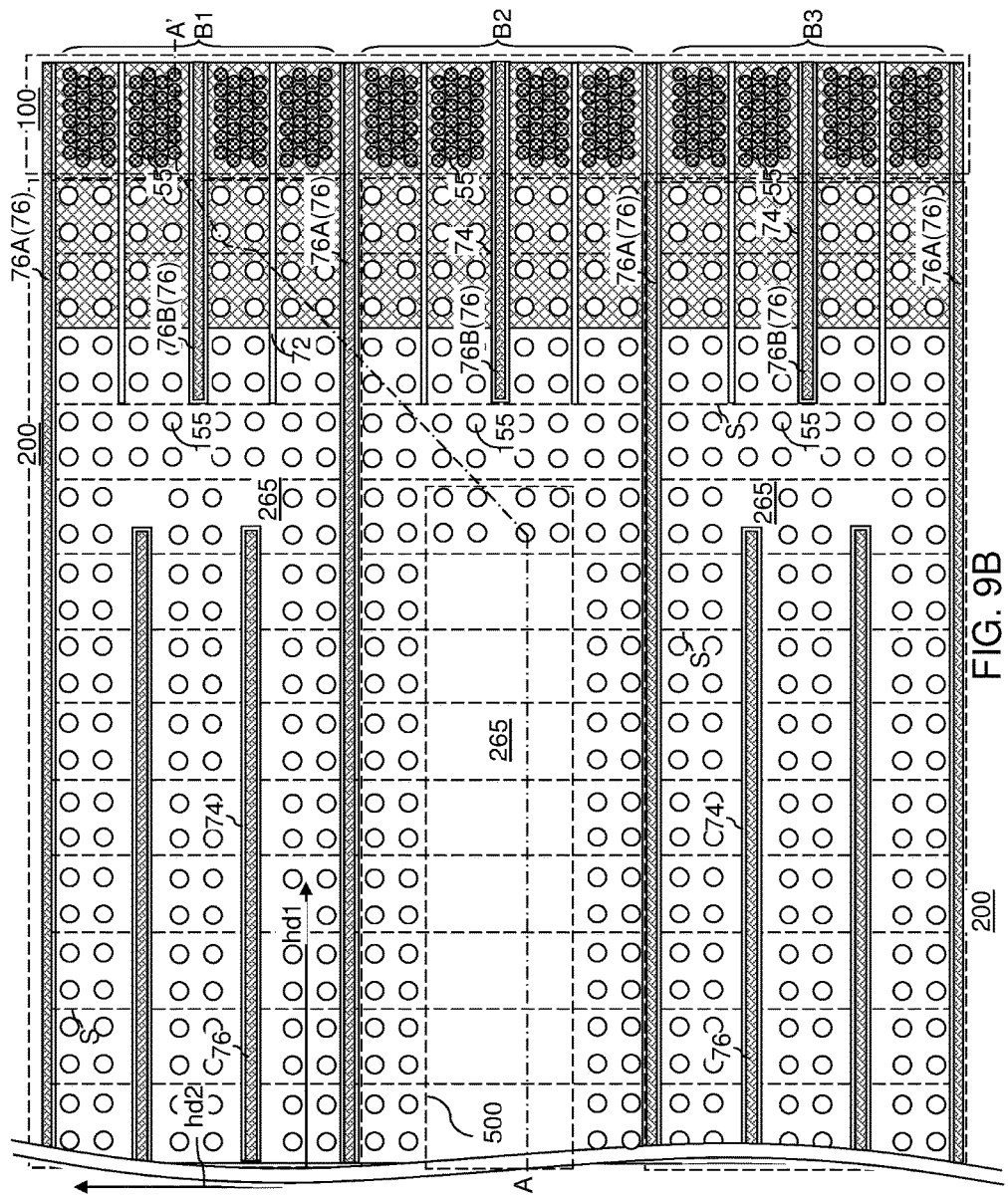
FIG. 9B is a horizontal cross-sectional view of the exemplary structure along the horizontal planeB-B' in FIG. 9A. The zig-zag vertical plane A-A' corresponds to the plane of the vertical cross-sectional view of FIG. 9A.
Figure 9C:
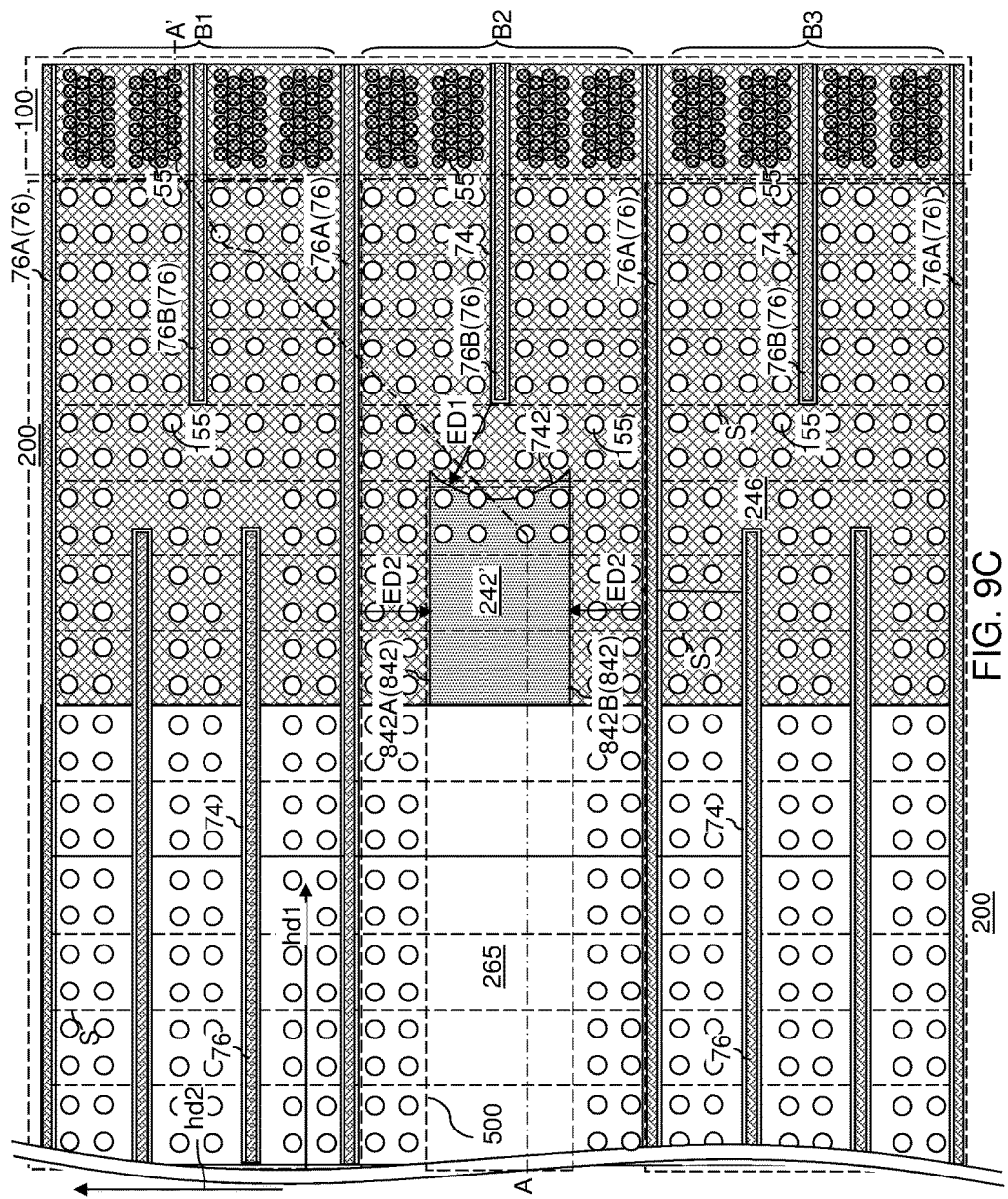
FIG. 9C is a horizontal cross-sectional view of the exemplary structure along the horizontal planeC-C' in FIG. 9A.
Figure 9D:
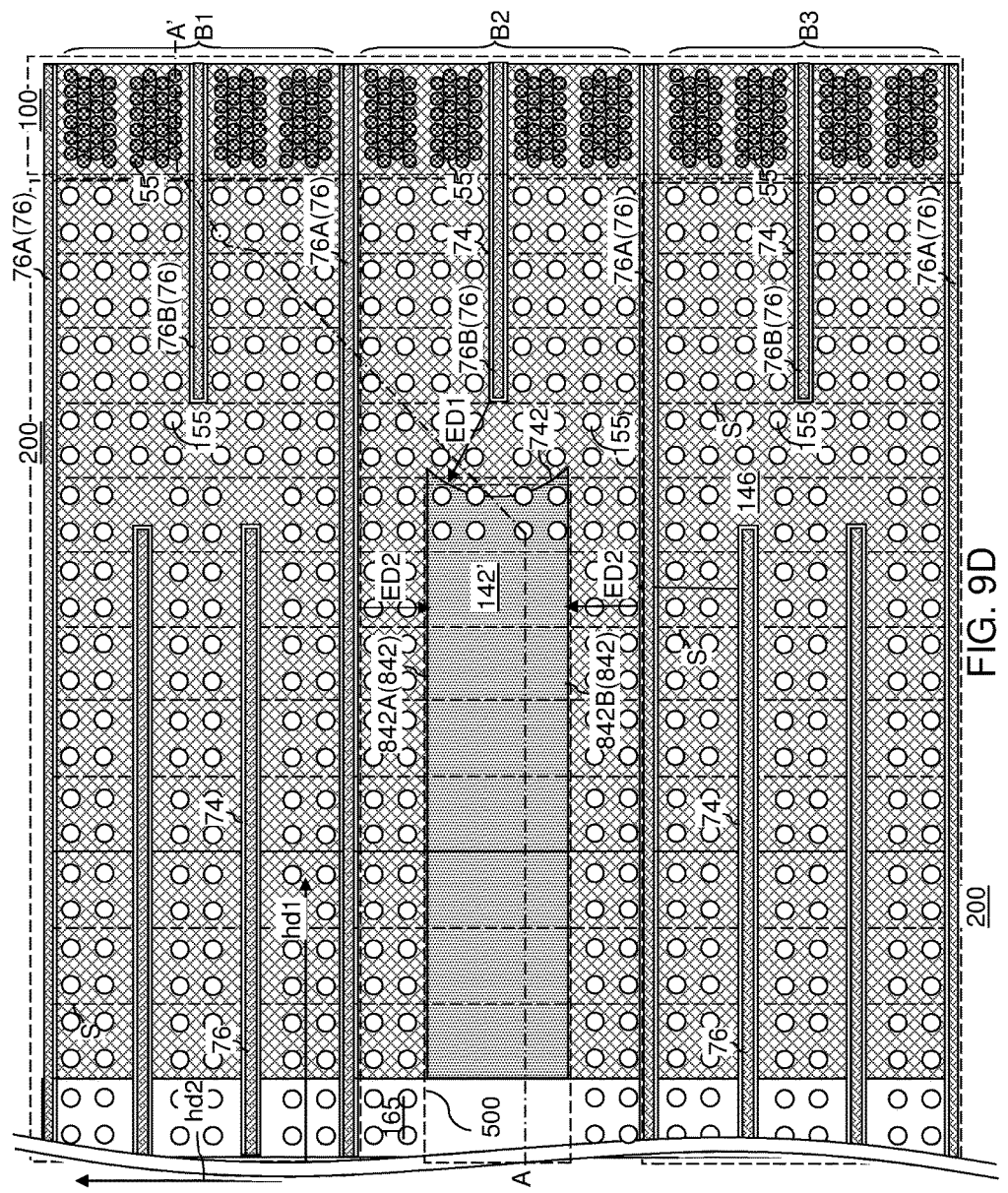
FIG. 9D is a horizontal cross-sectional view of the exemplary structure along the horizontal planeD-D' in FIG. 9A.

In one embodiment, the at least one second alternating stack (132, 142', 232, 242') has at least one concave substantially vertical sidewall 742 that is adjoined to the first planar substantially vertical sidewall 842 or the second planar substantially vertical sidewall 842. In one embodiment, each of the at least one concave substantially vertical sidewall 742 is laterally spaced from a respective most proximal laterally-elongated contact via structure 76 extending through the second block B2 in the array region 100 by the substantially same lateral offset distance, which can be the sum of the first etch distance ED1 and the thickness of an insulating spacer 74. As shown in FIGS. 9C and 9D, there may be more than one concave substantially vertical sidewall 742 between parallels sidewalls 842 in the same block B2.

Referring to FIGS. 10A-10E, at least one through-memory-level via cavity can be formed in each through-memory-level via region 500 through the at least one alternating stack of insulating layers (132, 232) and spacer dielectric layers (142', 242') and at least one retro-stepped dielectric material portion (165, 265). For example, at least one through-memory-level via cavity extending through the memory-level assembly can be formed in the area of the second staircase region in block B2. The at least one through-memory-level via cavity can be formed, for example, by applying a photoresist layer over the contact level dielectric layer 280, lithographically patterning the photoresist layer to form an opening over each through-memory-level via region 500, and anisotropically etching the portions of the contact level dielectric layer 280 and the memory-level assembly that underlie the openings in the photoresist layer. Each through-memory-level via cavity is formed through a remaining portion (132, 142', 232, 242') of the at least one alternating stack (132, 142, 232, 242).

The at least one through-memory-level via cavity is formed only in the through-memory-level via regions 500, and is not formed in the word line contact via regions 200 or in the memory array region 100. The areas of the word line contact via regions 200 or in the memory array region 100 are covered with a masking layer such as the patterned photoresist layer.

The at least one through-memory-level via cavity can extend through the entirety of the memory-level assembly (e.g., through dielectric layers (132, 142', 232, 242')), and into the at least one lower level dielectric material layer 760. In one embodiment, a topmost surface of a lower level metal interconnect structure 780 can be physically exposed at the bottom of each through-memory-level via cavity. In one embodiment, each through-memory-level via cavity can comprise substantially vertical sidewalls that extend through the memory-level assembly and an upper portion of the at least one lower level dielectric material layer 760.

A through-memory-level via structure 576 is formed within each through-memory-level via cavity by deposition of at least one conductive material (such as TiN, W, Cu, etc.). Excess portions of the deposited conductive material(s) are removed from above the top surface of the contact level dielectric layer 280 by a planarization process (such as chemical mechanical planarization and/or a recess etch). At least one through-memory-level via structure 576 is formed through the remaining portion (132, 142', 232, 242') of the at least one alternating stack (132, 142, 232, 242) as originally formed. Each of the at least one through-memory-level via structure 576 can extend from a first horizontal plane HP1 including a topmost surface of the memory-level assembly and a second horizontal plane HP2 including a bottommost surface of the memory-level assembly Each of the at least one through-memory-level via structure 576 contacts sidewalls of the spacer dielectric layers (142', 242') in the remaining portion (132, 142', 232, 242') of the at least one alternating stack (132, 142, 232, 242), and is laterally spaced from each of the electrically conductive layers (146, 246) by a region of a respective spacer dielectric layer (142', 242'). In one embodiment, the at least one through-memory-level via structure 576 can be formed on the lower level metal interconnect structures 780.

Figure 10A:
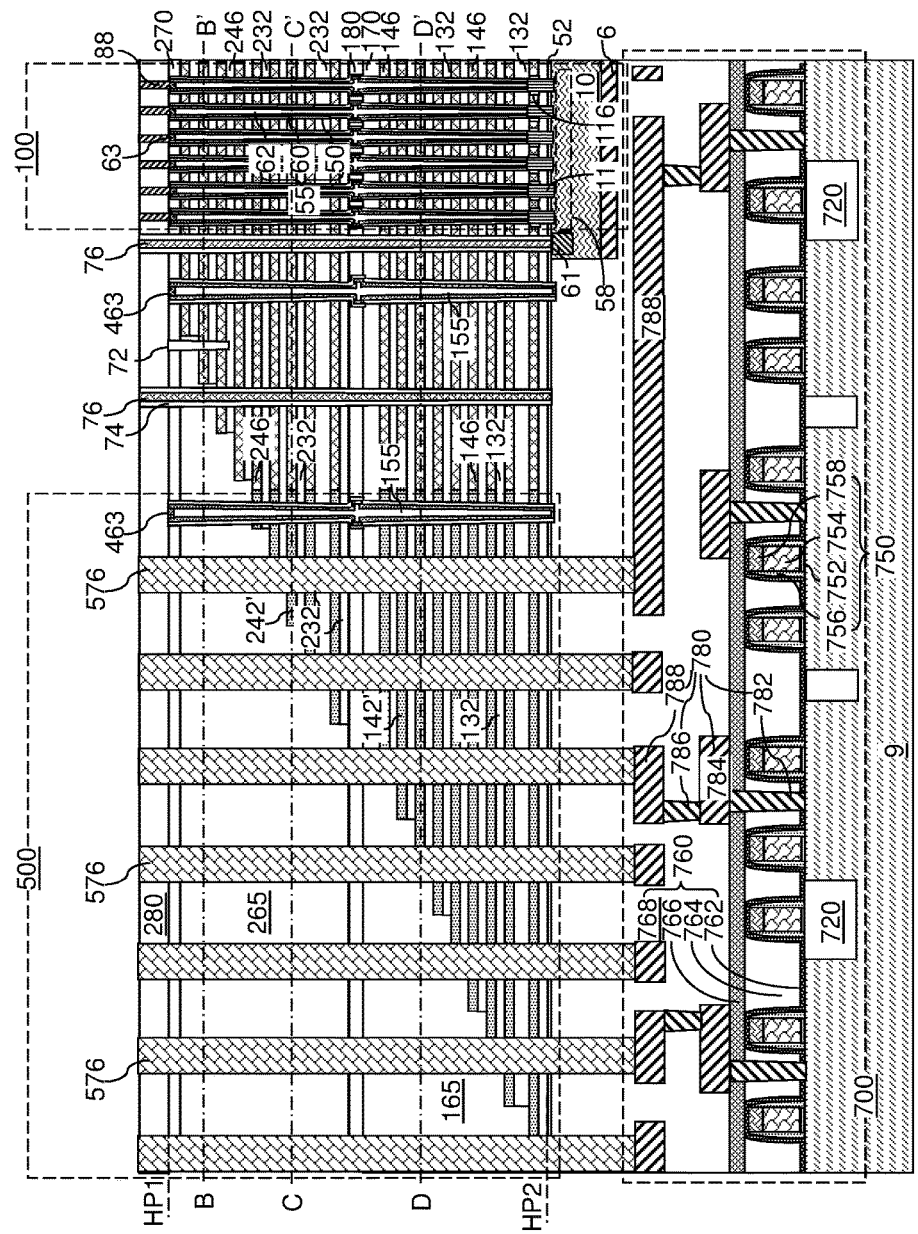
FIG. 10A is a vertical cross-sectional view of the exemplary structure after formation of through-memory-level via structures and various contact via structures according to an embodiment of the present disclosure.
Figure 10B:
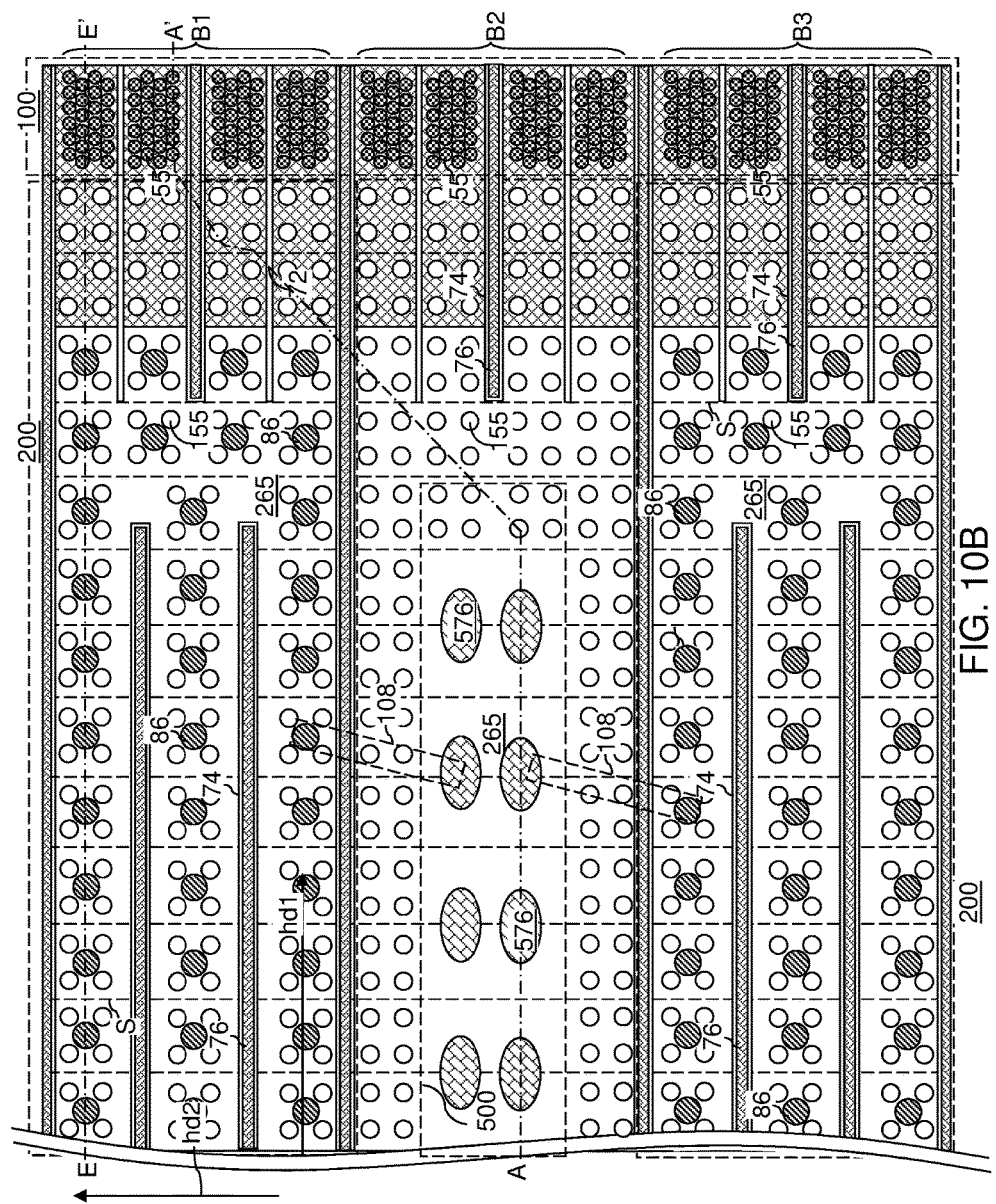
FIG. 10B is a horizontal cross-sectional view of the exemplary structure along the horizontal planeB-B' in FIG. 10A. The zig-zag vertical plane A-A' corresponds to the plane of the vertical cross-sectional view of FIG. 10A.
Figure 10C:
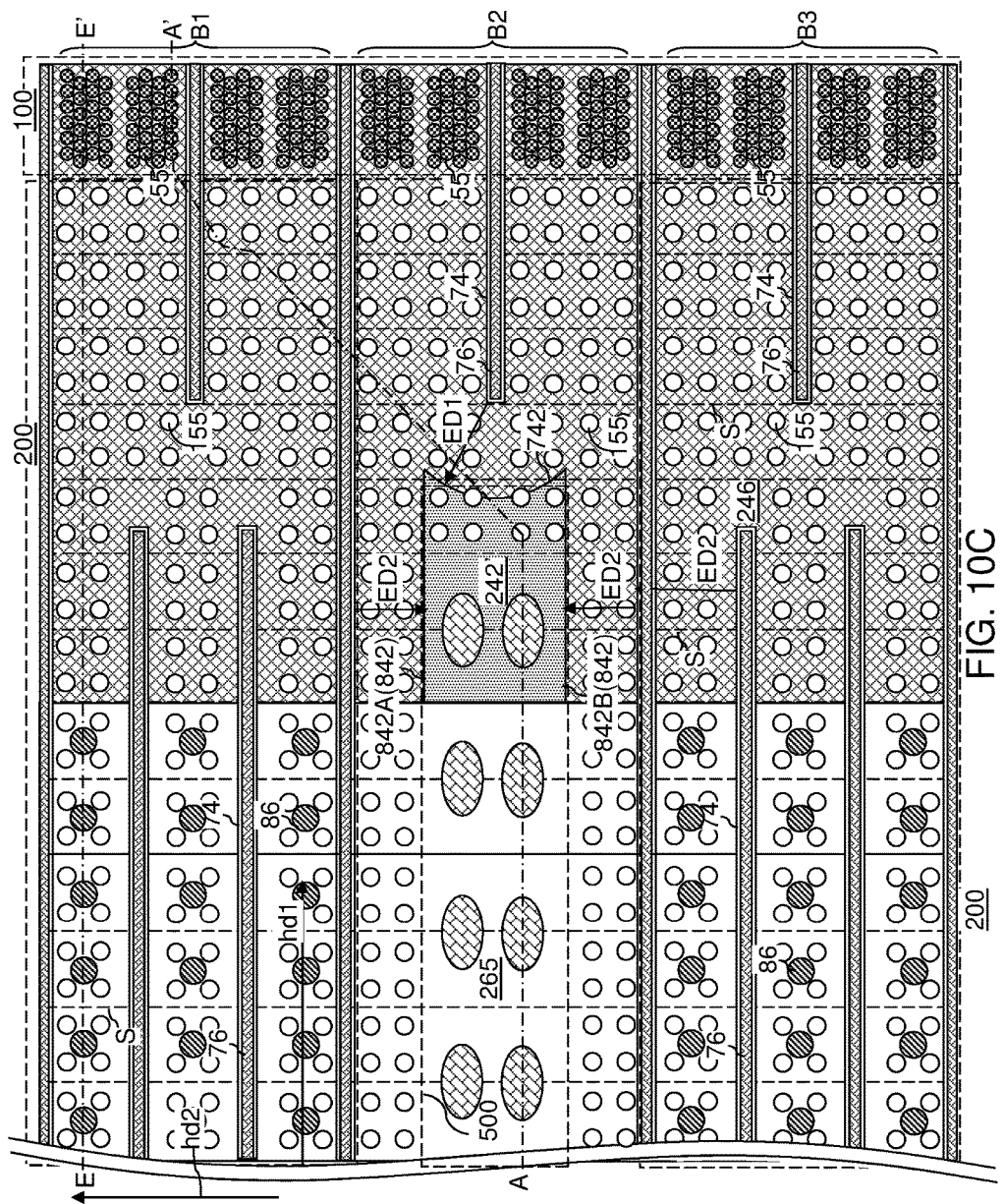
FIG. 10C is a horizontal cross-sectional view of the exemplary structure along the horizontal planeC-C' in FIG. 10A.
Figure 10D:
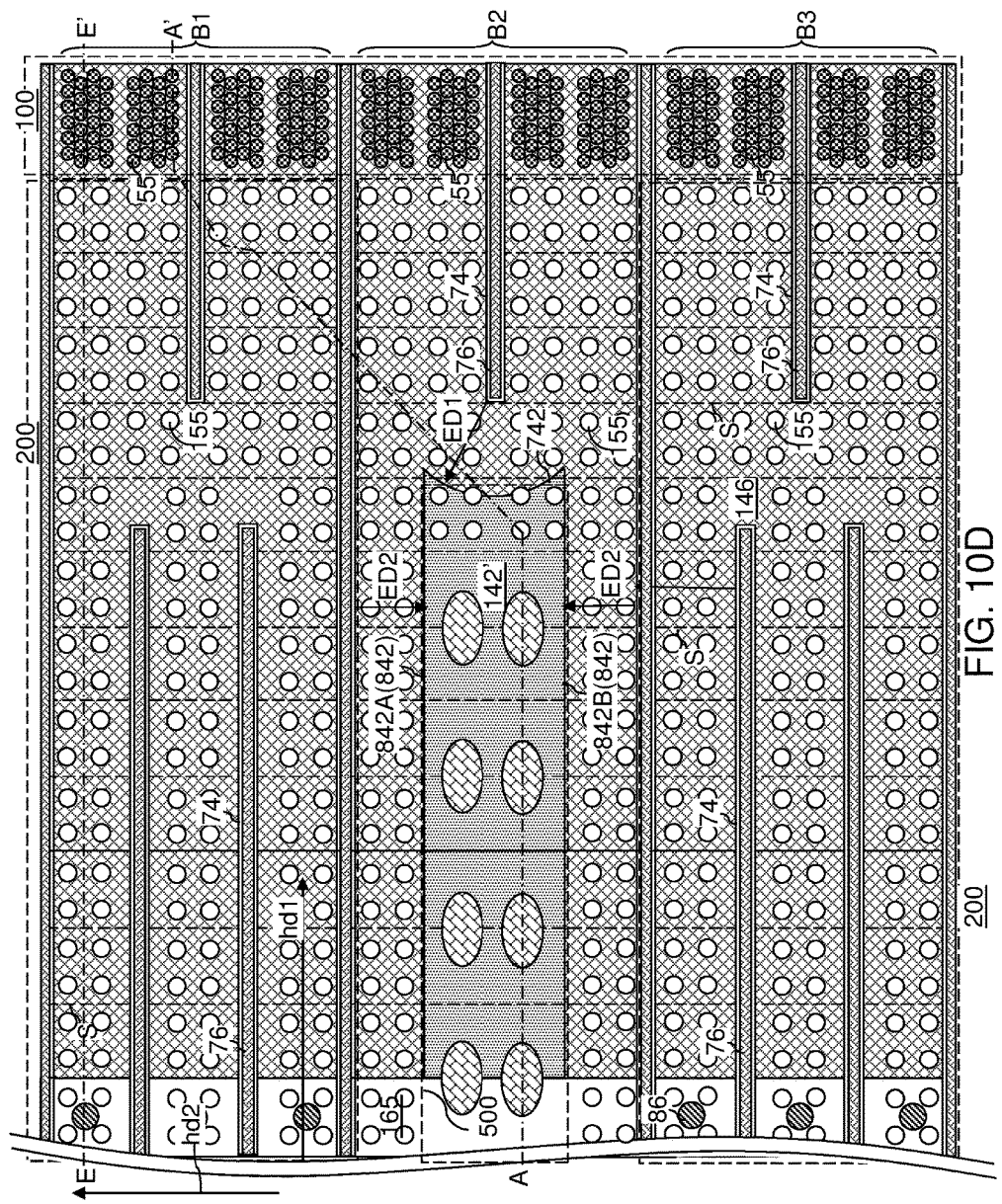
FIG. 10D is a horizontal cross-sectional view of the exemplary structure along the horizontal planeD-D' in FIG. 10A.
Figure 10E:
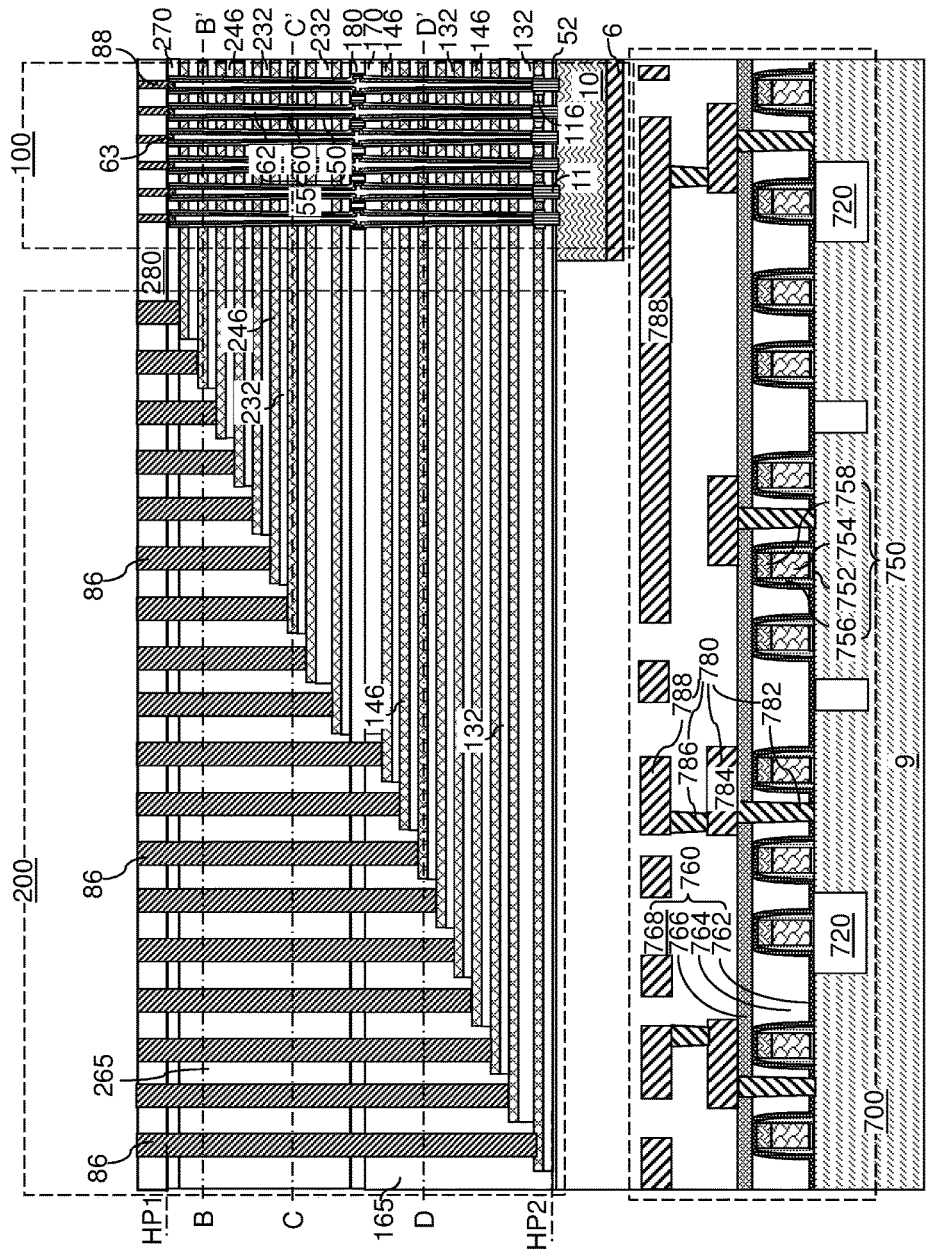
FIG. 10E is a vertical cross-sectional view of the exemplary structure of FIGS. 10B-10D along the vertical planeE-E' in FIGS. 10B-10Daccording to an embodiment of the present disclosure.

Additional contact via structures can be formed through the contact level dielectric layer 280 and underlying dielectric materials on various nodes of the memory device in the memory-level assembly. Specifically, word line contact via structures 86 can be formed through the contact level dielectric layer 280 and the second-tier retro-stepped dielectric material portion 265 and optionally, the first-tier retro-stepped dielectric material portion 165 in the contact region 200, as shown in FIG. 10E. A subset of the word line contact via structures 86 contacting the second electrically conductive layers 246 extends through the second-tier retro-stepped dielectric material portion 265, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165.

Drain contact via structures 88 contacting the drain regions 63 can extend through the contact level dielectric layer 280 and the second insulating cap layer 270 in the array region 100. Each via structure (576, 86, 88) may be formed employing a respective set of patterning processes and fill processes. Alternatively, two or more types of via structures (576, 86, 88) may be formed employing a common set of patterning processes and fill processes provided that the anisotropic etch process therein can control vertical extent of cavities at target height levels for each type of cavities that are simultaneously formed.

In one embodiment, the word line contact via structures 86 can be formed through the at least one retro-stepped dielectric material portion (165, 265) over the first staircase region (such as the illustrated word line contact via region 200) and third staircase regions (another instance of the word line contact via region 200) and directly on respective portions of electrically conductive layers (146, 246) in the first and third blocks (B1, B3), while not forming any contact via structure over the second staircase region (such as the illustrated through-memory-level via region 500).

In one embodiment, the through-memory-level via structures 576 can be formed in the areas of even-numbered staircase regions such as the second staircase region while the odd-numbered staircase regions (or vice-versa) such as the first and third staircase regions remain intact. As used herein, a region or a structure "remains intact" if no substantial change in structure is made to the region or to the structure.

Figure 11:
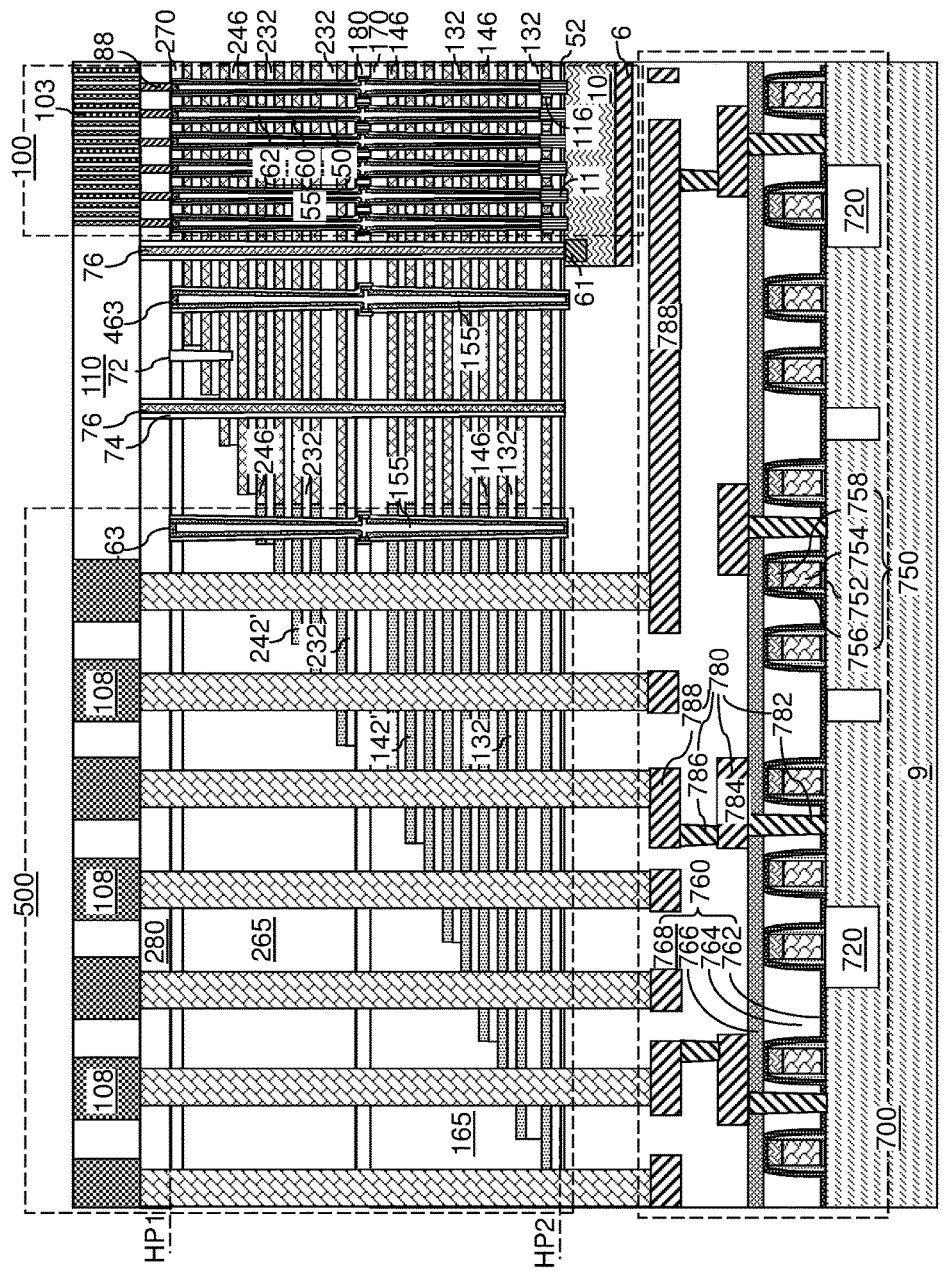
FIG. 11 is a vertical cross-sectional view of the exemplary structure after formation of upper level line structures according to an embodiment of the present disclosure.

Referring to FIG. 11, a line level dielectric layer 110 can be formed over the contact level dielectric layer 280. Various metal interconnect structures (108, 103) can be formed in the line level dielectric layer 110. The metal interconnect structures (108, 103) can include upper level metal interconnect structures 108 that are formed on respective pairs of a word line contact via structure 86 and a through-memory-level via structure 576, and bit lines 103 that extend along the second horizontal direction hd2 and perpendicular to the first horizontal direction hd1 and contact structures 88.

The upper level metal interconnect structures 108 can be electrically connected to respective word lines as embodied as electrically conductive layers (146, 246) by structures 86, and electrically connected to the nodes (e.g., source, drain or gate) of the driver circuit semiconductor devices (e.g., CMOS devices) 710 located under the memory level assembly by structures 576 and 760. In one embodiment, the driver circuit semiconductor devices 710 may comprise word line decoder circuit devices or word line switching circuit devices, or power supply/distribution circuit devices. For example, the semiconductor devices 710 can include word line switching devices for electrically biasing word lines (146, 246) of three-dimensional memory structures. The semiconductor devices 710 are electrically connected to the word lines (146, 246) by structures 760, 576, 108 and 86. Structures 576 extend vertically through region 500 and connect to structures 108 above region 500. Structures 108 extend horizontally from region 500 to adjacent regions 200 where structures 108 contact structures 86. The exemplary located of structures 108 as viewed from the top is shown in FIG. 10B in dashed lines. Alternatively or in addition, at least some of the structures 576 may comprise a power strap, which is a conductive line which connects the driver circuit semiconductor devices 710 to an external power source. Alternatively, the semiconductor devices 710 may comprise bit line decoder circuit devices, bit line sensing devices and/or switching circuit devices, such as sense amplifier circuit devices, which are electrically connected to the bit lines 103. The devices 710 may be located on the substrate 9 under the alternating stack (132, 146, 232, 246) and semiconductor material layer 10 in the array region 100 and/or under the alternating stack (132, 142', 232, 242') and dielectrics (165, 265) at the bottom of region 500.

The exemplary structure of the present disclosure can include a semiconductor structure comprising: a memory-level assembly located over a semiconductor substrate 9 and comprising at least one first alternating stack of electrically conductive layers (146, 246) and first portions of insulating layers (132, 232), and further comprising memory stack structures 55 vertically extending through the at least one first alternating stack (132, 146, 232, 246); and a plurality of laterally-elongated contact via structures 76 that is located within respective trenches 79, which vertically extend through the memory-level assembly, and laterally extend along a first horizontal direction hd1. A first subset 76A of the plurality of laterally-elongated contact via structures 76 laterally divides the at least one alternating stack into a plurality of laterally spaced-apart blocks (B1, B2, B3, etc.). The plurality of blocks comprises a set of three neighboring blocks including, in order, a first block B1, a second block B2, and third block B3 arranged along a second horizontal direction hd2 that is perpendicular to the first horizontal direction hd2. The semiconductor structure further comprises at least one second alternating stack (132, 142', 232, 242') adjoining the second block B2 and including alternating layers of spacer dielectric layers (142', 242') and second portions of the insulating layers (132, 232), and each of the spacer dielectric layers (142', 242') is located at a same level as a respective electrically conductive layer (146, 246), and each spacer dielectric layer (142', 242') has a lesser lateral extent along the first horizontal direction hd1 than any underlying spacer dielectric layer (142', 242'). The semiconductor structure further comprises at least one through-memory-level via structure 576 comprising a conductive material and vertically extending through the at least one second alternating stack from a first horizontal plane HP1 including a topmost surface of the memory-level assembly and a second horizontal plane HP2 including a bottommost surface of the memory-level assembly.

In one embodiment, the at least one through-memory-level via structure 576 contacts a top surface of a lower level metal interconnect structure 780 underlying the memory-level assembly and a bottom surface of an upper level metal interconnect structure 108 overlying the memory-level assembly.

In one embodiment, the semiconductor structure comprises at least one lower level dielectric layer 760 overlying the semiconductor substrate 9; and a planar semiconductor material layer 10 overlying the at least one lower level dielectric layer 760, underlying the memory-level assembly, and including horizontal semiconductor channels 58 electrically connected to vertical semiconductor channels 60 within the memory stack structures 55.

The semiconductor structure can further comprise semiconductor devices located on the semiconductor substrate. The lower level metal interconnect structure 780 is electrically shorted to at least one node of the semiconductor devices, and is embedded in the at least one lower level dielectric layer 760. In one embodiment, the upper level metal interconnect structure 108 overlies the memory-level assembly, is electrically coupled to a node of the memory stack structures 55 (for example, to the memory elements embodied as portions of the memory material layer 54 at the levels of the electrically conductive layers (146, 246) through capacitive coupling), and is embedded in at least one upper level dielectric layer 110.

In one embodiment, the at least one second alternating stack (132, 142', 232, 242') is located on a lengthwise end of the second block B2 and between a staircase region of the first block B1 and a staircase region of the third block B3. Each staircase region of the first and third blocks (B1, B3) includes terraces in which each underlying electrically conductive layer (146, 246) extends farther along the first horizontal direction hd1 than any overlying electrically conductive layer (146, 246) within the memory-level assembly.

The exemplary structure and modifications thereof can include a three-dimensional memory structure. The memory stack structures 55 can comprise memory elements of a vertical NAND device. The electrically conductive layers (146, 246) can comprise, or can be electrically connected to, a respective word line of the vertical NAND device. The semiconductor substrate 9 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (58, 11, 60) extends substantially perpendicular to a top surface of the semiconductor substrate 9, a plurality of charge storage elements (as embodied as portions of the memory material layer 54 located at each word line level), each charge storage element located adjacent to a respective one of the plurality of semiconductor channels (58, 11, 60), and a plurality of control gate electrodes (as embodied as a subset of the electrically conductive layers (146, 246) having a strip shape extending substantially parallel to the top surface of the semiconductor substrate 9 (e.g., along the first horizontal direction hd1), the plurality of control gate electrodes comprise at least a first control gate electrode located in the first device level and a second control gate electrode located in the second device level.

The via structures 576 located in region 500 provide an electrical contact to the driver circuit semiconductor devices 710 located under the memory array to decrease the overall device size/footprint over the substrate and utilize device area that is not fully utilized in prior art devices, which decreases the device cost. With use of "unused" staircase area 500 for word line switching semiconductor devices 710 and/or for lower metal layers for word line hookup connection, the total number of metal layers is reduced. In the case of sense amplifier semiconductor devices 710 located under the memory array, the embodiment configuration provides additional lower electrically conductive layers for the sense amplifier routing and power supply with a minimum number of upper layers (e.g., two layers).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
a memory-level assembly located over a semiconductor substrate and comprising an alternating stack of insulating layers and spacer dielectric layers having portions thereof replaced with electrically conductive layers, wherein a respective spacer dielectric layer and a respective electrically conductive layer are laterally adjoined to each other, and wherein each spacer dielectric layer within the alternating stack other than a bottommost one of the spacer dielectric layers within the alternating stack has a greater lateral extent than any overlying one of the spacer dielectric layers within the alternating stack;
a retro-stepped dielectric material portion overlying, and contacting, stepped surfaces of the alternating stack;
memory stack structures vertically extending through the alternating stack, wherein each of the memory stack structures comprises:
a vertical semiconductor channel; and
a memory film comprising a tunneling dielectric and charge storage regions; and
at least one through-memory-level via structure consisting of at least one conductive material and vertically extending through the retro-stepped dielectric material portion, a respective subset of the spacer dielectric layers within the alternating stack, and a respective subset of the insulating layers within the alternating stack, and is laterally spaced from each of the electrically conductive layers within the alternating stack.

2. The semiconductor structure of claim 1, wherein:
the spacer dielectric layers of the alternating stack comprise concave substantially vertical sidewalls; and
the concave substantially vertical sidewalls of spacer dielectric layers are vertically coincident among one another.

3. The semiconductor structure of claim 2, wherein each of the concave substantially vertical sidewalls of the spacer dielectric layers contacts, or is uniformly spaced from, a respective convex substantially vertical sidewall of the electrically conductive layers.

4. The semiconductor structure of claim 3, further comprising:
backside contact trenches vertically extending through the memory-level assembly, and laterally extending along a first horizontal direction; and
laterally-elongated contact via structures that are located within a respective one of the backside contact trenches,
wherein:
the concave substantially vertical sidewalls of the spacer dielectric layers are substantially equidistant from a sidewall of one of the backside contact trenches.

5. The semiconductor structure of claim 4, wherein at least two of the concave substantially vertical sidewalls of the spacer dielectric layers contact at least two convex substantially vertical sidewalls of the electrically conductive layers of the alternating stack at substantially vertical interfaces.

6. The semiconductor structure of claim 2, wherein one of the spacer dielectric layers comprises a first planar substantially vertical sidewall and a second planar substantially vertical sidewall that laterally extend along a first horizontal direction and laterally spaced apart by a width of the one of the spacer dielectric layers along a second horizontal direction that is perpendicular to the first horizontal direction.

7. The semiconductor structure of claim 6, further comprising:
backside contact trenches vertically extending through the memory-level assembly, and laterally extending along a first horizontal direction; and
laterally-elongated contact via structures that are located within a respective one of the backside contact trenches,
wherein:
each of the first planar substantially vertical sidewall and the second planar substantially vertical sidewall is laterally spaced from a sidewall of one of the backside contact trenches by a substantially same lateral offset distance; and
the one of the spacer dielectric layers comprises a concave substantially vertical sidewall that is adjoined to the first planar substantially vertical sidewall and the second planar substantially vertical sidewall.

8. The semiconductor structure of claim 1, wherein the alternating stack includes stepped surfaces that contact bottom surfaces and sidewall surfaces of the respective retro-stepped dielectric material portion.

9. The semiconductor structure of claim 1, further comprising:
a planar semiconductor material layer underlying the memory-level assembly, and including horizontal semiconductor channels electrically connected to, and directly contacting bottom ends of, vertical semiconductor channels within the memory stack structures; and
at least one lower level dielectric layer underlying an entirety of a bottom surface of the planar semiconductor material layer and overlying the semiconductor substrate,
wherein each of the at least one through-memory-level via structure comprises a respective bottom surface that is located below a horizontal Wane including the bottom surface of the planar semiconductor material layer.

10. The semiconductor structure of claim 9, wherein each of the at least one through-memory-level via structure directly contacts a metallic top surface of a respective lower level metal interconnect structure underlying a horizontal plane including a bottommost surface of the memory-level assembly and laterally surrounded by the at least one lower level dielectric layer, and directly contacts a metallic bottom surface of a respective upper level metal interconnect structure overlying a horizontal plane including a topmost surface of the memory-level assembly.

11. The semiconductor structure of claim 9, further comprising driver circuit semiconductor devices located on the semiconductor substrate, comprising source regions and drain regions embedded within an upper portion of the semiconductor substrate, and vertically spaced apart from, and located below, the planar semiconductor material layer, wherein a lower level metal interconnect structure is electrically shorted to at least one node of the semiconductor devices, and is embedded in the at least one lower level dielectric layer.

12. The semiconductor structure of claim 11, further comprising word line contact via structures which are electrically shorted to a respective one of the electrically conductive layers in the alternating stack.

13. The semiconductor structure of claim 12, further comprising:
an upper level metal interconnect structure that is electrically shorted to one of the word line contact via structures and one of the at least one through-memory-level via structure; and
driver circuit semiconductor devices located on the semiconductor substrate and comprising source regions and drain regions embedded within an upper portion of the semiconductor substrate and comprising word line switching semiconductor devices,
wherein:
the electrically conductive layers of the alternating stack comprise word lines of a NAND memory device; and
one of the word line switching semiconductor devices is electrically shorted to one of the word lines through the lower level metal interconnect structure, one of the at least one through-memory-level via structure, one of the upper level metal interconnect structures, and the one of the word line contact via structures.

14. The semiconductor structure of claim 1, wherein:
the memory stack structures comprises memory elements of a vertical NAND device;
the electrically conductive layers comprise, or are electrically connected to, a respective word line of the vertical NAND device;
the semiconductor substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;

the silicon substrate contains an integrated circuit comprising the word line driver circuit and a bit line driver circuit for the memory device; and the array of monolithic three-dimensional NAND strings comprises:
   a plurality of semiconductor channels, wherein at least one end portion of each of the plurality of semiconductor channels extends substantially perpendicular to a top surface of the semiconductor substrate;
   a plurality of charge storage elements, each charge storage element located adjacent to a respective one of the plurality of semiconductor channels; and
   a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

15. The semiconductor structure of claim 1, wherein each of the electrically conductive layers is located entirely between:
   a respective first horizontal plane including a top surface of a spacer dielectric layer; and
   a respective second horizontal plane including a bottom surface of the spacer dielectric layer.

16. The semiconductor structure of claim 1, wherein:
   an entirety of each spacer dielectric layer is located between a pair of horizontal planes which are parallel to a top surface of the semiconductor substrate; and
   only a single one of the electrically conductive layers is present between the pair of horizontal planes.

17. The semiconductor structure of claim 16, wherein the pair of horizontal planes comprises:
   a first horizontal plane including a top surface of a spacer dielectric layer; and
   a second horizontal plane including a bottom surface of the spacer dielectric layer.

18. The semiconductor structure of claim 1, wherein:
   each of the spacer dielectric layers includes a respective top surface and a respective bottom surface, and is located entirely between a respective first horizontal plane including the respective top surface and a respective second horizontal plane including the respective bottom surface, wherein only a single one of the electrically conductive layers within the alternating stack is present between the respective first horizontal plane and the respective second horizontal plane.

19. The semiconductor structure of claim 18, wherein:
   each of the spacer dielectric layers is located between a respective vertically neighboring pair of insulating layers among the insulating layers of the alternating stack, each vertically neighboring pair of insulating layers including a respective upper insulating layer and a respective lower insulating layer without any intervening insulating layer therebetween;

the respective first horizontal plane includes an entirety of a bottom surface of an upper insulating layer within the respective vertically neighboring pair of insulating layers; and
the respective second horizontal plane includes an entirety of a top surface of a lower insulating layer within the respective vertically neighboring pair of insulating layers.

20. The semiconductor structure of claim 1, wherein each insulating layer within the alternating stack other than a bottommost one of the insulating layers within the alternating stack has a greater lateral extent than any overlying one of the insulating layers within the alternating stack.

21. The semiconductor structure of claim 1, wherein each respective spacer dielectric layer is in direct contact with a respective vertically neighboring pair of insulating layers in the alternating stack, each vertically neighboring pair of insulating layers include a respective upper insulating layer and a respective lower insulating layer without any intervening insulating layer therebetween.

22. The semiconductor structure of claim 1, wherein:
   the at least one through-memory-level via structure is located in a through-memory-level via region;
   the spacer dielectric layers are located in the through-memory-level via region; and
   the portions of the spacer dielectric layers located outside the through-memory-level via region are replaced with the electrically conductive layers.

23. The semiconductor structure of claim 1, wherein:
   an entire top surface of each of the spacer dielectric layers is in direct contact with a bottom surface of a respective one of the insulating layers or a bottom surface of a respective dielectric material portion; and
   an entire bottom surface of each of the spacer dielectric layers is in direct contact with a top surface of a respective one of the insulating layers or a top surface of a respective dielectric material portion.

24. The semiconductor structure of claim 1, wherein:
   the insulating layers comprise silicon oxide; and
   the spacer dielectric layers consist essentially of silicon nitride.

25. The semiconductor structure of claim 1, wherein:
   the spacer dielectric layers comprise a plurality of spacer dielectric layers as a subset;
   each spacer dielectric layer within the plurality of spacer dielectric layers has a maximum vertical extent that is the same as a vertical spacing between a respective vertically neighboring pair of insulating layers among the insulating layers of the alternating stack, each vertically neighboring pair of insulating layers including a respective upper insulating layer and a respective lower insulating layer without any intervening insulating layer therebetween.

* * * * *